(12) United States Patent
Walker

(10) Patent No.: US 6,593,624 B2
(45) Date of Patent: Jul. 15, 2003

(54) THIN FILM TRANSISTORS WITH VERTICALLY OFFSET DRAIN REGIONS

(75) Inventor: Andrew J. Walker, Mountain View, CA (US)

(73) Assignee: Matrix Semiconductor, Inc., Santa Clara, CA (US)

(*) Notice: Subject to any disclaimer, the term of this patent is extended or adjusted under 35 U.S.C. 154(b) by 0 days.

(21) Appl. No.: 09/961,278

(22) Filed: Sep. 25, 2001

(65) Prior Publication Data

US 2003/0057435 A1 Mar. 27, 2003

(51) Int. Cl.[7] .................. H01L 29/94; H01L 31/062; H01L 31/113; H01L 31/119
(52) U.S. Cl. .................. 257/344; 257/66; 257/324; 257/347; 257/408
(58) Field of Search .................. 257/66, 324, 344, 257/347, 408

(56) References Cited

U.S. PATENT DOCUMENTS

| | | |
|---|---|---|
| 3,414,892 A | 12/1968 | McCormack et al. |
| 3,432,827 A | 3/1969 | Sarno |
| 3,571,809 A | 3/1971 | Nelson |
| 3,573,757 A | 4/1971 | Adams |
| 3,576,549 A | 4/1971 | Hess |
| 3,582,908 A | 6/1971 | Koo |
| 3,629,863 A | 12/1971 | Neale |
| 3,634,929 A | 1/1972 | Yoshida et al. |
| 3,671,948 A | 6/1972 | Cassen et al. |
| 3,699,543 A | 10/1972 | Neale |

(List continued on next page.)

FOREIGN PATENT DOCUMENTS

| | | |
|---|---|---|
| EP | 0 073 486 A2 | 8/1982 |
| EP | 0 387 834 A2 | 9/1990 |
| EP | 0 395 886 A2 | 11/1990 |
| EP | 0 516 866 A1 | 12/1992 |
| EP | 0 606 653 A1 | 7/1994 |

(List continued on next page.)

OTHER PUBLICATIONS

Abou–Samra S.J.: "3D CMOS SOI for High Performance Computing", Low Power Electronics and Design Proceedings, 1998.

Yamazaki K.: "4–Layer 3–D IC Technologies for Parallel Signal Processing", International Electron Devices Meeting Technical Digest, Dec. 9–12, 1990, pp. 25.5.1–25.5.4.

Schlaeppi H.P.: "nd Core Memories using Multiple Coincidence", IRL Transactions on Electronic Computers, Jun. 1960, pp. 192–196.

(List continued on next page.)

Primary Examiner—Ngân V. Ngô
(74) Attorney, Agent, or Firm—Foley & Lardner

(57) ABSTRACT

There is provided a semiconductor device, such as a TFT, with a vertical drain offset region. The device contains a substrate having an upper first surface, a semiconductor channel region of a first conductivity type over the first surface, a gate electrode and a gate insulating layer between the gate electrode and the channel region. The device also contains a heavily doped semiconductor source region of a second conductivity type, a heavily doped semiconductor drain region of a second conductivity type. An intrinsic or lightly doped semiconductor drain offset region is located between the drain region and the channel region, such that the drain region is offset from the channel region at least partially in a direction perpendicular to the first surface.

71 Claims, 11 Drawing Sheets

U.S. PATENT DOCUMENTS

| | | |
|---|---|---|
| 3,717,852 A | 2/1973 | Abbas et al. |
| 3,728,695 A | 4/1973 | Frohman-Bentchkowsky |
| 3,787,822 A | 1/1974 | Rioult |
| 3,846,767 A | 11/1974 | Cohen |
| 3,863,231 A | 1/1975 | Taylor |
| 3,877,049 A | 4/1975 | Buckley |
| 3,886,577 A | 5/1975 | Buckley |
| 3,922,648 A | 11/1975 | Buckley |
| 3,980,505 A | 9/1976 | Buckley |
| 3,990,098 A | 11/1976 | Mastrangelo |
| 4,146,902 A | 3/1979 | Tanimoto et al. |
| 4,177,475 A | 12/1979 | Holmberg |
| 4,203,123 A | 5/1980 | Shanks |
| 4,203,158 A | 5/1980 | Frohman-Bentchkowsky et al. |
| 4,272,880 A | 6/1981 | Pashley |
| 4,281,397 A | 7/1981 | Neal et al. |
| 4,419,741 A | 12/1983 | Stewart et al. |
| 4,420,766 A | 12/1983 | Kasten |
| 4,442,507 A | 4/1984 | Roesner |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,500,905 A | 2/1985 | Shibata |
| 4,507,757 A | 3/1985 | McElroy |
| 4,535,424 A | 8/1985 | Reid |
| 4,543,594 A | 9/1985 | Mohsen et al. |
| 4,569,121 A | 2/1986 | Lim et al. |
| 4,630,096 A | 12/1986 | Drye |
| 4,646,266 A | 2/1987 | Ovshinsky et al. |
| 4,672,577 A | 6/1987 | Hirose |
| 4,677,742 A | 7/1987 | Johnson |
| 4,686,758 A | 8/1987 | Liu et al. |
| 4,692,994 A | 9/1987 | Moniwa et al. |
| 4,710,798 A | 12/1987 | Marcantonio |
| 4,811,082 A | 3/1989 | Jacobs |
| 4,811,114 A | 3/1989 | Yamamoto et al. |
| 4,820,657 A | 4/1989 | Hughes et al. |
| 4,823,181 A | 4/1989 | Mohsen et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 5,001,539 A | 3/1991 | Inoue et al. |
| 5,070,383 A | 12/1991 | Sinar et al. |
| 5,070,384 A | 12/1991 | McCollum et al. |
| 5,089,862 A | 2/1992 | Warner, Jr. et al. |
| 5,160,987 A | 11/1992 | Pricer et al. |
| 5,191,405 A | 3/1993 | Tomita et al. |
| 5,191,551 A | 3/1993 | Inoue |
| 5,202,754 A | 4/1993 | Bertin et al. |
| 5,266,912 A | 11/1993 | Kledzik |
| 5,283,458 A | 2/1994 | Stokes et al. |
| 5,283,468 A | 2/1994 | Kondo |
| 5,306,935 A | 4/1994 | Esquivel et al. |
| 5,311,039 A | 5/1994 | Kimura et al. |
| 5,321,286 A | 6/1994 | Koyama et al. |
| 5,334,880 A | 8/1994 | Abadeer et al. |
| 5,379,255 A | 1/1995 | Shah |
| 5,391,518 A | 2/1995 | Bhushan |
| 5,391,907 A | 2/1995 | Jang |
| 5,398,200 A | 3/1995 | Mazure et al. |
| 5,422,435 A | 6/1995 | Takiar et al. |
| 5,426,566 A | 6/1995 | Beilstein, Jr. |
| 5,427,979 A | 6/1995 | Chang |
| 5,434,745 A | 7/1995 | Shokrgozar et al. |
| 5,441,907 A | 8/1995 | Sung et al. |
| 5,453,952 A | 9/1995 | Okudaira |
| 5,455,445 A | 10/1995 | Kurtz et al. |
| 5,463,244 A | 10/1995 | De Araujo et al. |
| 5,468,663 A | 11/1995 | Bertin et al. |
| 5,468,997 A | 11/1995 | Imai et al. |
| 5,471,090 A | 11/1995 | Deutsch |
| 5,481,133 A | 1/1996 | Hsu |
| 5,495,398 A | 2/1996 | Takiar et al. |
| 5,502,289 A | 3/1996 | Takiar et al. |
| 5,517,044 A | 5/1996 | Koyama |
| 5,523,622 A | 6/1996 | Harada et al. |
| 5,523,628 A | 6/1996 | Williams et al. |
| 5,535,156 A | 7/1996 | Levy et al. |
| 5,536,968 A | 7/1996 | Crafts et al. |
| 5,552,963 A | 9/1996 | Burns |
| 5,561,622 A | 10/1996 | Bertin et al. |
| 5,581,498 A | 12/1996 | Ludwig et al. |
| 5,585,675 A | 12/1996 | Knopf |
| 5,612,570 A | 3/1997 | Eide et al. |
| 5,654,220 A | 8/1997 | Leedy |
| 5,675,547 A | 10/1997 | Koga |
| 5,693,552 A | 12/1997 | Hsu |
| 5,696,031 A | 12/1997 | Wark |
| 5,703,747 A | 12/1997 | Voldman et al. |
| 5,737,259 A | 4/1998 | Chang |
| 5,745,407 A | 4/1998 | Levy et al. |
| 5,751,012 A | 5/1998 | Wolstenholme et al. |
| 5,768,192 A | 6/1998 | Eitan |
| 5,776,810 A | 7/1998 | Guterman et al. |
| 5,780,925 A | 7/1998 | Cipolla et al. |
| 5,781,031 A | 7/1998 | Bertin et al. |
| 5,801,437 A | 9/1998 | Burns |
| 5,825,046 A | 10/1998 | Czubatyj et al. |
| 5,835,396 A | 11/1998 | Zhang |
| 5,883,409 A | 3/1999 | Guterman et al. |
| 5,915,167 A | 6/1999 | Leedy |
| 5,966,603 A | 10/1999 | Eitan |
| 5,969,380 A | 10/1999 | Syyedy |
| 5,976,953 A | 11/1999 | Zavracky et al. |
| 5,978,258 A | 11/1999 | Manning |
| 5,982,003 A * | 11/1999 | Hu et al. .................. 257/347 |
| 5,985,693 A | 11/1999 | Leedy |
| 6,028,326 A | 2/2000 | Uochi et al. |
| 6,034,882 A | 3/2000 | Johnson et al. |
| 6,057,598 A | 5/2000 | Payne et al. |
| 6,066,547 A | 5/2000 | Maekawa |
| 6,072,193 A | 6/2000 | Ohnuma et al. |
| 6,072,234 A | 6/2000 | Camien et al. |
| 6,075,719 A | 6/2000 | Lowrey et al. |
| 6,087,674 A | 7/2000 | Ovshinsky et al. |
| 6,087,722 A | 7/2000 | Lee et al. |
| 6,110,278 A | 8/2000 | Saxena |
| 6,133,640 A | 10/2000 | Leedy |
| 6,137,718 A | 10/2000 | Reisinger |
| 6,141,241 A | 10/2000 | Ovshinsky et al. |
| 6,185,122 B1 | 2/2001 | Johnson et al. |
| 6,197,641 B1 | 3/2001 | Hergenrother et al. |
| 6,208,545 B1 | 3/2001 | Leedy |
| RE37,259 E | 7/2001 | Ovshinsky |
| 6,281,042 B1 | 8/2001 | Ahn et al. |
| 6,291,858 B1 | 9/2001 | Ma et al. |
| 6,307,257 B1 | 10/2001 | Huan et al. |
| 6,314,013 B1 | 11/2001 | Ahn et al. |
| 6,322,903 B1 | 11/2001 | Siniaguine et al. |
| 6,337,521 B1 | 1/2002 | Masuda |
| 6,351,028 B1 | 2/2002 | Akram |
| 6,353,265 B1 | 3/2002 | Michii |
| 6,355,501 B1 | 3/2002 | Fung et al. |
| 2001/0055838 A1 | 12/2001 | Walker et al. |
| 2002/0028541 A1 | 3/2002 | Lee et al. |
| 2002/0093052 A1 * | 7/2002 | Masuda .................. 257/347 |

FOREIGN PATENT DOCUMENTS

| | | |
|---|---|---|
| EP | 0 644 548 A2 | 9/1994 |
| EP | 0 800 137 A1 | 3/1997 |
| JP | 6-22352 | 2/1985 |
| JP | 61-222216 | 10/1986 |
| JP | 5-082787 | 4/1993 |
| JP | 6-338602 | 12/1994 |
| JP | 63-52463 | 3/1998 |
| WO | WO 91/26083 | 11/1994 |

OTHER PUBLICATIONS

Schlaeppppi H.P.: "Session V: Information Storage Techniques", International Solid–State Circuits Conference, Feb. 11, 1960, pp. 54–55.

De Graaf C. et al.: "A Novel High–Density, Low–Cost Diode Programmable Read Only Memory," IEDM, beginning at page 189.

Peter K. Naji et al.: "A 256kb 3.0V IT1MTJ Nonvolatile Magnetoresistive RAM," 2001 IEEE International Solid–State Conference, Digest of Technical Papers, ISSCC 2001/Session 7/Technology Directions: Advanced Technologies/7.6, Feb. 6, 2001, pp. 122–123 (including enlargement of figures, totaling 9 pages), and associated Visual Supplement, pp. 94–95,4040–405 (enlargements of slides submitted, totaling 25 pages).

Kim C. Hardee et al.: "A Fault–Tolerant 30 ns/375 mW 16K×1 NMOS Static RAM," IEEE Journal of Solid–State Circuits, Oct. 1981, vol. SC–16, No. 5, pp. 435–443.

Toshio Wada et al.: "A 15–ns 1024–Bit Fully Static MOS RAM," IEEE Journal of Solid–State Circuits, Oct. 1978, vol. SC–13, No. 5, pp. 635–639.

Camperi–Ginestet C.: "Vertical Electrical Interconnection of Compound Semiconductor Thin–Film Devices to Underlying Silicon Circuitry", IEEE Photonics Technology Letters, vol. 4, No. 9, Sep. 1992, pp. 1003–1006.

Akasaka Yoichi: Three–Dimensional Integrated Circuit: Technology and Application Prospect, Microelectronics Journal, vol. 20, No.s 1–2, 1989, pp. 105–112.

Sakamoto Kaji: "Architecture des Circuits a Trois Dimension (Architecture of Three Dimensional Devices)", Bulletin of the Electrotechnical Laboratory, ISSN 0366–9092, vol. 51, No. 1, 1987, pp. 16–29.

Akasaka Yoichi: "Three–dimensional IC Trends", Proceedings of the IEEE, vol. 74, No. 12, 1986, pp. 1703–1714.

Carter William H.: "National Science Foundation (NSF) Forum on Optical Science and Engineering", Proceedings SPIE—The International Society for Optical Engineering, vol. 2524, Jul. 11–12, 1995, (Article by N. Joverst titled "Manufacturable Multi–Material Integration Compound Semi–conductor Devices Bonded to Silicon Circuitry".*

Hayashi Y.: "A New Three Dimensional IC Fabrication Technology, Stacking Thin Film Dual–CMOS Layers", IEDM, 1991, pp. 25.6.1–25.6.4.*

Reber M.: "Benefits of Vertically Stacked Integrated Circuits for Sequential Logic", IEEE, 1996, pp. 121–124.*

Stern Jon M.: Design and Evaluation of an Epoxy Three–dimensional Multichip Module, IEEE Transactions on Components, Packaging, and Manufacturing Technology—Part B, vol. 19, No. 1, Feb. 1996, pp. 188–194.*

Bertin Claude L.: "Evaluation of a Three–dimensional Memory Cube System", IEEE Transactions on Components, Hybrids, and Manufacturing Technology, vol. 16, No. 8, Dec. 1993, pp. 1006–1011.*

Watanabe Hidehiro: "Stacked Capacitor Cells for High–density Dynamic RAMs", IEDM, 1988, pp. 600–603.*

Web Page: "Stacked Memory Modules", IBM Technical Disclosure Bulletin, vol. 38, No. 5, 1995.*

Thakur Shashidhar: "An Optimal Layer Assignment Algorithm for Minimizing Crosstalk for Three VHV Channel Routing", IEDM, 1995, pp. 207–210.*

Terril Rob: "3D Packaging Technology Overview and Mass Memory Applications", IEDM, 1996, pp. 347–355.*

Inque Y.: "A Three–Dimensional Static RAM", IEEE Electron Device Letters, vol. 7, No. 5, May 1986, pp. 327–329.*

Reber M.: "Benefits of Vertically Stacked Integrated Circuits for Sequential Logic", IEDM, 1996, pp. 121–124.*

Kurokawa Takakazu: "3–D VLSI Technology in Japan and an Example: A Syndrome Decoder for Double Error Correction", FGCS—Future, Generation, Computer, Systems, vol. 4, No. 2, 1988, pp. 145–155, Amsterdam, The Netherlands.*

Makiniak David: "Vertical Integration of Silicon Allows Packaging of Extremely Dense System Memory In Tiny Volumes: Memory–chip Stacks Send Density Skyward", Electronic Design, No. 17, Aug. 22, 1994, pp. 69–75, Cleveland Ohio.

Yamazaki K.: "Fabrication Technologies for Dual 4–KBIT Stacked SRAM", IEDM 16.8., 1986, pp. 435–438.

Pein Howard: "Performance of the 3–D Pencil Flash EPROM Cell an Memory Array", IEEE Transactions on Electron Devices, vol. 42, No. 11, Nov. 1995, pp. 1982–1991.

Abstract Lomatch S.: "Multilayered Josephson Junction Logic and Memory Devices", Proceedings of the SPIE–The International Society for Optical Engineering vol. 2157, pp. 332–343.

Abstract Lu N.C.C.: "Advanced Cell Structures for Dynamic RAMs", IEEE Circuits and Devices Magazine, vol. 5, No. 1, Jan. 1989, pp. 27–36.

Abstract Sakamoto K.: "Architecture of Three Dimensional Devices", Journal: Bulletin of the Electrotechnical Laboratory, vol. 51, No. 1, 1987, pp. 16–29.

Abstract "Wide Application of Low–Cost Associative Processing Associative Processing Seen", Electronic Engineering Times, Aug. 26, 1996, p. 43.

Abstract "Interconnects & Packaging", Electronic Engineering Times, Nov. 27, 1995, p. 43.

Abstract "Closing in on Gigabit DRAMs", Electronic Engineering Times, Nov. 27, 1995, p. 35.

Abstract "Module Pact Pairs Cubic Memory with Vision-Tek", Semiconductor Industry & Business Survey, vol. 17, No. 15, Oct. 23, 1995.

Abstract "Layers of BST Materials Push Toward 1 Gbit DRAM", Electronics Times, Oct. 19, 1995.

Abstract "Technologies Will Pursue Higher DRAM Densities", Electronic News (1991), Dec. 4, 1994, p. 12.

Abstract "Looking Diverse Storage", Electronic Engineering Times, Oct. 31, 1994, p. 44.

Abstract "Special Report: Memory Market Startups Cubic Memory: 3D Space Savers", Semiconductor Industry & Business Survey, vol. 16, No. 13, Sep. 12, 1994.

Abstract "Technique Boosts 3D Memory Density", Electronic Engineering Times, Aug. 29, 1994, p. 16.

Abstract "Memory Packs Poised 3D Use", Electronic Engineering Times, Dec. 7, 1992, p. 82.

Abstract "MCMs Hit the Road", Electronic Engineering Times, Jun. 15, 1992, p. 45.

Abstract "IEDM Ponders the 'Gigachip' Era", Electronic Engineering Times, Jan. 20, 1992, p. 33.

Abstract "Tech Watch: 1–Gbit DRAM in Sight", Electronic World News, Dec. 16, 1991, p. 20.

Abstract "MCMs Meld into Systems", Electronic Engineering Times, Jul. 22, 1991, p. 35.

Abstract "Systems EEs See Future in 3D", Electronic Engineering Times, Sep. 24, 1990, p. 37.

Patent Application, Nishiura, US 2001/00054759 A1.

Patent Application, Furusawa, US 2002/0024146 A1.

Patent Application, Fujimoto et al, US 2002/0027275 A1.

Patent Application, Akram, US 2002/0030262 A1.

Patent Application, Akram, US 2002/0030263 A1.

Patent Application, Leedy, US 2001/0033030 A1.

Chan et al. "Three Dimensional CMOS integrated Circuits on Large Grain Polysilicon Films" EEE, *Hong Kong University of Science and Technology* 2000 IEEE.

"3D Chip–On–Chip Stacking," Semiconductor International, Dec. 1991.

Richard, W. Lay: "TRW Develops Wireless Multiboard interconnect System," Electronic Engineering Times, Nov. 5, 1984.

C. Hayxelden et al.: "Silicide Formation and Silicide–Mediated Crystallization of Nickel–Implanted Amorphous Silicon Thin Films," J. Appl. Phys., Jun. 15, 1993, pp. 8279–8289, 73 (12), 1993 American Institute of Physics.

David Burnett et al.: "An Advanced Flash Memory Technology on SOI," 1998, pp. 983–986, IEEE.

A. Chatterjee et al.: "Sub–100nm Gate Length Metal Gate NMOS Transistors Fabricated by a Replacement Gate Process," 1997, pp. 821–824, IEEE.

A. Chatterjee et al.: "CMOS Metal Replacement Gate Transistors Using Tantalum Pentoxide Gate Insulator," 1998, pp. 777–780, IEEE.

David K. Y. Liu et al.: "Scaled Dielectric Antisense Structure for Field–Programmable Gate Array Applications," IEEE Electron Device Letters, Apr. 1991, pp. 151–153, vol. 12, No. 4, IEEE.

Singh Jagar et al.: "Characterization of MOSFET's Fabricated on Large–Grain Polysilicon on Insulator," Solid–State Electronics 45, 2001, pp. 743–749, Elsevier Science Ltd.

Zhonghe Jin et al.: "The Effects of Extended Heat Treatment on Ni Induced Lateral Crystallization of Amorphous Silicon Thin Films," IEEE Transactions on Electron Devices, vol. 46, No. 1, Jan. 1999, pp. 78–82, IEEE.

A. Sato, et al. "A 0.5–$\mu$m EEPROM Cell Using Poly–Si TFT Technology," IEEE Transactions on Electron Devices, vol. 40, No. 11, Nov. 1993, p. 2126.

Vivek Subramanian et al.: "High–Performance Germanium–Seeded Laterally Crystallized TFT's for Vertical Device Integration," IEEE Transactions on Electron Devices, vol. 45, No. 9, Sep. 1998, pp. 1934–1939, IEEE.

Vivek Subramanian et al.: "Low–Leakage Germanium–Seeded Laterally–Crystallized Single–Grain 100–nm TFT's for Vertical Integration Applications," IEEE Electron Device Letters, vol. 20, No. 7, Jul. 1999, pp. 341–343, IEEE.

K.S. Kim et al.: "A Novel Dual String NOR (DuSNOR) Memory Cell Technology Scalable to the 256 Mbit and 1 Gbit Flash Memories," IEDM, 1995, pp. 263–266, IEEE.

Boaz Eitan et al.: "NROM: A Novel Localized Trapping, 2–Bit Nonvolatile Memory Cell," IEEE Electron Device Letters, vol. 21, No. 11, Nov. 2000, pp. 543–545, IEEE.

Marvin H. White et al.: "A Low Voltage SONOS Nonvolatile Semiconductor Memory Technology," IEEE Transactions on Components, Packaging, and Manufacturing Technology, Part A., vol. 20, No. 2, Jun. 1997, pp. 190–195, IEEE.

Min–Hwa Chi et al.: "Programming and Erase with Floating–Body for High Density Low Voltage Flash EEPROM Fabricated on SOI Wafers," Proceedings 1995 IEEE International SOI Conference, Oct. 1995, pp. 129–130.

S. Koyama: "A Novel Cell Structure for Giga–bit EPROMs and Flash Memories Using Polysilicon Thin Film Transistors," Symposium on VLSI Technology Digest for Technical Papers, 1992, pp. 44–45, IEEE.

Hongmei Wang et al.: "Submicron Super TFTs for 3–D VLSI Applications," IEEE Electron Device Letters, Sep. 2000, pp. 439–441, vol. 21, No. 9, IEEE.

K.W. Lee et al.: "Three Dimensional Shared Memory Fabricated Using Wafer Stacking Technology," 2000, IEEE.

John R. Lindsey et al.: "Polysilicon Thin Film Transistor for Three Dimensional Memory," Electrochemical Society Meeting 198th, Oct. 2000, Phoenix, AZ.

Seiichi Aritome: "Advanced Flash Memory Technology and Trends for File Storage Application," IEEE, 2000.

Toshiaki Yamanaka et al.: "Advanced TFT SRAM Cell Technology Using a Phase–Shift Lithography," IEEE Transactions on Electron Devices, Jul. 1995, pp. 1305–1313, vol. 42, No. 7, IEEE.

Sung–Hoi Hur et al.: "A Poly–Si Thin–Film Transistor EEPROM Cell with a Folded Floating Gate," IEEE Transactions on Electron Devices, Feb. 1999, pp. 436–438, vol. 46, No. 2, IEEE.

Jung–Dal Choi et al.: "A 0.15 $\mu$m NAND Flash Technology with 0.11 $\mu m^2$ Cell Size for 1 Gbit Flash Memory," IEEE, 2000.

H. Shirai et al.: "A 0.54 $\mu m^2$ Self–Aligned, HSG Floating Gate Cell (SAHF Cell) for 256Mbit Flash Memories," IEEE, 1995, pp. 653–656.

Takuya Kitamura et al.: "A Low Voltage Operating Flash Memory Cell with High Coupling Ratio Using Horned Floating Gate with Fine HSG," IEEE, 1998, pp. 104–105.

Ken Takeuchi et al.: "A Dual–Page Programming Scheme for High–Speed Multigigabit–Scale NAND Flash Memories," IEEE Journal of Solid–State Circuits, May 2001, pp. 744–751, vol. 36, No. 5, IEEE.

Tiao–Yuan Huang et al.: "Device Sensitivity of Field–Plated Polysilicon High–Voltage TFT's and Their Application to Low–Voltage Operation," IEEE Electron Device Letters, Nov. 1990, vol. 11, No. 11, pp. 541–543, IEEE.

S. Batra et al.: "Development of Polysilicon TFT's for 16 MB SRAM's and Beyond," IEEE Transactions on Electron Devices, Nov. 1993, vol. 40, No. 11, pp. 2125–2126, IEEE.

Toshiaki Yamanaka et al.: "Advanced TFT SRAM Cell Technology Using a Phase–Shift Lithography," IEEE Transactions on Electron Devices, Jul. 1995, vol. 42, No. 7, pp. 1305–1313, IEEE.

Ichiro Fujiwara et al.: "0.13 $\mu$m Metal–Oxide–Nitride–Oxide–Semiconductor Single Transistor Memory Cell with Separated Source Line," Feb. 2000, Jpn. J. Appl. Phys., vol. 39, Part 1, No. 2A, pp. 417–423, Publication Board, Japanese Journal of Applied Physics.

John H. Douglas: "The Route to 3–D Chips," High Technology, Sep. 1983, pp. 55–59, vol. 3, No. 9, High Technology Publishing Corporation, Boston, MA.

M. Arienzo et al.: "Diffusion of Arsenic in Bilayer Polycrystalline Silicon Films," J. Appl. Phys., Jan. 1984, pp. 365–369, vol. 55, No. 2, American Institute of Physics.

O. Bellezza et al.: "A New Self–Aligned Field Oxide Cell for Multimegabit Eproms," IEDM, pp. 579–582, IEEE.

S.D. Brotherton et al.: "Excimer–Laser–Annealed Poly–Si Thin–Film Transistors," IEEE Transactions on Electron Devices, Feb. 1993, pp. 407–413, vol. 40, No. 2, IEEE.

P. Candelier et al.: "Simplified 0.35–$\mu$m Flash EEPROM Process Using High–Temperature Oxide (HTO) Deposited by LPCVD as Interpoly Dielectrics and Peripheral Transistors Gate Oxide," IEEE Electron Device Letters, Jul. 1997, pp. 306–308, vol. 18, No. 7, IEEE.

Min Cao et al.: "A High–Performance Polysilicon Thin–Film Transistor Using XeCl Excimer Laser Crystallization of Pre–Patterned Amorphous Si Films," IEEE Transactions on Electron Devices, Apr. 1996, pp. 561–567, vol. 43, No. 4, IEEE.

Mino Cao et al.: "A Simple EEPROM Cell Using Twin Polysilicon Thin Film Transistors," IEEE Electron Device Letters, Aug. 1994, pp. 304–306, vol. 15, No. 8, IEEE.

Bomy Chen et al.: "Yield Improvement for a 3.5–ns BICMOS Technology in a 200–mm Manufacturing Line," IBM Technology Products, 1993, pp. 301–305, VLSITSA.

Victor W.C. Chan et al.: "Three Dimensional CMOS Integrated Circuits on Large Grain Polysilicon Films," IEDM, 2000, IEEE.

Boaz Eitan et al.: "Alternate Metal Virtual Ground (AMG)—A New Scaling Concept for Very High–Density EPROM's," IEEE Electron Device Letters, pp. 450–452, vol. 12, No. 8, Aug. 1991, IEEE.

Boaz Eitan et al.: "Multilevel Flash cells and their Trade–offs," IEEE Electron Device Letters, pp. 169–172, 1996, IEEE.

Dr. Heinrich Endert: "Excimer Lasers as Tools for Material Processing in Manufacturing," Technical Digest: International Electron Devices Meeting, 1985, pp. 28–29, Washington, DC, Dec. 1–4, 1985, , Göttingen, Germany.

Dov Frohman–Bentchkowsky: "A Fully Decoded 2048–Bit Electrically Programmable FAMOS Read–Only Memory," IEEE Journal of Solid–State Circuits, pp. 301–306, vol. sc–6, No. 5, Oct. 1971.

G.K. Giust et al.: "Laser–Processed Thin–Film Transistors Fabricated from Sputtered Amorphous–Silicon Films," IEEE Transactions on Electron Devices, pp. 207–213, vol. 47, No. 1, Jan. 2000, IEEE.

G.K. Giust et al.: "High–Performance Thin–Film Transistors Fabricated Using Excimer Laser Processing and Grain Engineering," IEEE Transactions on Electron Devices, pp. 925–932, vol. 45, No. 4, Apr. 1998, IEEE.

G.K. Giust et al.: "High–Performance Laser–Processed Polysilicon Thin–Film Transistors," IEE Electron Device Letters, pp. 77–79, vol. 20, No. 2, Feb. 1999, IEEE.

Fumihiko Hayashi et al.: "A Self–Aligned Split–Gate Flash EEPROM Cell with 3–D Pillar Structure," 1999 Symposium on VLSI Technology Digest of Technical Papers, pp. 87–88, Stanford University, Stanford, CA 94305, USA.

Stephen C.H. Ho et al.: "Thermal Stability of Nickel Silicides in Different Silicon Substrates," Department of Electrical and Electronic Engineering, pp. 105–108, 1998, IEEE.

J. Esquivel et al.: "High Density Contactless, Self Aligned EPROM Cell Array Technology," Texas Instruments (Dallas), IEDM 86, pp. 592–595, 1986, IEEE.

R. Kazerounian et al.: Alternate Metal Virtual Ground EPROM Array Implemented in a 0.8$\mu$m Process for Very High Density Applications, IEDM 91, pp. 311–314, 1991, IEEE.

Chang–Dong Kim et al.: "Short–Channel Amorphous–Silicon Thin–Film Transistors," IEEE Transactions on Electron Devices, pp. 2172–2176, vol. 43, No. 12, Dec. 1996, IEEE.

Johan H. Klootwijk et al.: "Deposited Inter–Polysilicon Dielectrics for Nonvolatile Memories," IEEE Transactions on Electron Devices, pp. 1435–1445, vol. 46, No. 7, Jul. 1999, IEEE.

Ja–Hum Ku et al.: "High Performance pMOSFETs With Ni(Si/sub x/Ge/sub 1–x Si/Sub 0.8/Ge/sub 0.2/ gate, IEEE Xplore Citation," VLSI Technology, 200. Digest of Technical Paper Symposium on pp.: 114–115 Jun. 13–15, 2000.

Nae–In Lee et al.: "High–Performance EEPROM's Using N–and P–Channel Polysilicon Thin–Film Transistors with Electron Cyclotron Resonance N2O–Plasma Oxide," pp. 15–17, IEEE Electron Device Letters, vol. 20, No. 1, Jan. 1999, IEEE.

Jin–Woo Lee et al.: "Improved Stability of Polysilicon Thin–Film Transistors under Self–Healing and High Endurance EEPROM Cells for Systems–On–Panel," IEEE Electron Device Letters, 1998, pp. 265–268, IEEE.

Seok–Woon Lee et al.: "Pd induced lateral crystallization of Amorphous Si Thin Films," Appl. Phys. Lett. 66 (13), pp. 1671–1673, Mar. 27, 1995, American Institute of Physics.

K. Miyashita et al.: "Optimized Halo Structure for 80 nm Physical Gate CMOS Technology with Indium and Antimony Highly Angled Ion Implantation," IEDM 99–645, pp. 27.2.1–27.2.4, 1999, IEEE.

N.D. Young et al.: "The Fabrication and Characterization of EEPROM Arrays on Glass Using a Low–Temperature Poly–Si TFT Process," IEEE Transactions on Electron Devices, pp. 1930–1936, vol. 43, No. 11, Nov. 1996, IEEE.

Jung–Hoon Oh et al.: "A High–Endurance Low–Temperature Polysilicon Thin–Film Transistor EEPROM Cell," pp. 304–306, IEEE Electron Device Letters, vol. 21, No. 6, Jun. 2000, IEEE.

M.C. Poon. et al.: "Thermal Stability of Cobalt and Nickel Silicides in Amorpho Crystalline Silicon," p. 1, IEEE Xplore, Electron Devices Meeting, 1997, Proceedings, 19 Hong Kong, 2000, IEEE.

Noriaki Sato et al.: "A New Programmable Cell Utilizing Insulator Breakdown," IEDM 85, pp. 639–642, 1985, IEEE.

Takeo Shiba et al.: "In Situ Phosphorus–Doped Polysilicon Emitte Technology for Very High–Speed Small Emitter Bipolar Transistors," IEEE Transactions on Electron Devices, pp. 889–897, vol. 43, No. 6, Jun. 1996, IEEE.

Seungheon Song et al.: "High Performance Transitors with State–of–the–Art CMOS Technologies," IEDM 99, pp. 427–430, 1999, IEEE.

Yoshihiro Takao et al.: "Low–Power and High–Stability SRAM Technology Using a Laser–Recrystallized p–Channel SOI MOSFET," IEEE Transactions on Electron Devices, pp. 2147–2152, vol. 39, No. 9, Sep. 1992, IEEE.

Kenji Taniguchi et al.: "Process Modeling and Simulation: Boundary Conditions for Point–Defect–Based Impurity Diffusion Model," IEEE Transactions on Computer–Aided Design, pp. 1177–1183, vol. 9, No. 11, Nov. 1990, IEEE.

Hongmei Wang et al.: "Submicron Super TFTs for 3–D VLSI Applications," IEEE Electron Device Letters, pp. 391–393, vol. 21, No. 9, Sep. 2000, IEEE.

Hongmei Wang et al.: "Super Thin–Film Transistor with SOI CMOS Performance Formed by a Novel Grain Enhancement Method," IEEE Transactions on Electron Devices, pp. 1580–1586, vol. 47, No. 8, Aug. 2000, IEEE.

Marvin H. White et al. "On the Go With Sonos," Circuit & Devices, pp. 22–31, Jul. 2000, IEEE.

B.J. Woo et al.: "A Novel Memory Cell Using Flash Array Contactless Eprom (Face) Technology," IEDM, pp. 90–93, 1990, IEEE.

Qi Xiang et al.: "Deep sub–100 nm CMOS with Ultra Low Gate Sheet Resista NiSi," VLSI Technology, 2000. Digest of Technical Paper Symposium on . . . pp. 76–77, IEEE Xplore, Jun. 13–15, 2000.

Qi Xiang et al. "Deep Sub–100nm CMOS with Ultra Low Gate Sheet Resistance by NiSi," IEEE, pp. 76–77, 2000, Symposium on VLSI Technology Digest of Technical Papers.

Qiuxia Xu et al.: "New Ti–Salicide Process Using Sb and Ge Preamorphization for Sub–0.2 $\mu$m CMOS Technology," IEEE Transactions on Electron Devices, pp. 2002–2009, vol. 45, No. 9, Sep. 1998, IEEE.

Kuniyoshi Yoshikawa et al.: "An Asymmetrical Lightly Doped Source Cell for Virtual Ground High–Density EPROM's," IEEE Transactions on Electron Devices, pp. 1046–1051, vol. 37, No. 4, Apr. 1990, IEEE.

Vivek Subramanian: "Control of Nucleation and Grain Growth in Solid–Phase Crystallized Silicon for High–Performance Thin Film Transistors," A Dissertation submitted to the Department of Electrical Engineering and the Committee on Graduate Studies of Stanford University, 1998.

John R. Lindsey et al.: "Polysilicon Thin Film Transistor and EEPROM Characteristics for Three Dimensional Memory," The $198^{th}$ Meeting of the Electrochemical Society, Oct. 22–27, 2000, vol. 2000–2.

Brian Dipert: "Exotic Memories, Diverse Approaches," EDN Asia, Sep. 2001.

Dietmar Gogl et al.: "A 1–Kbit EEPROM in SIMOX Technology for High–Temperature Applications up to 250° C," IEEE Journal of Solid–State Circuits, Oct. 2000, vol. 35, No. 10, IEEE.

* cited by examiner

US 6,593,624 B2

THIN FILM TRANSISTORS WITH VERTICALLY OFFSET DRAIN REGIONS

FIELD OF THE INVENTION

The present invention is directed generally to semiconductor devices and methods of fabrication and more particularly to thin film transistors and method of fabrication.

BACKGROUND OF THE INVENTION

Thin film transistors (TFTS) are utilized in various devices, such as a liquid crystal displays, static random access memories and in nonvolatile memories. Conventional TFTs have a structure that is similar to conventional bulk metal oxide semiconductor field effect transistors (MOSFETs), except that TFTs are formed in a semiconductor layer that is located above an insulating substrate, such as a glass substrate or a semiconductor substrate that is covered by an insulating layer.

It is generally recognized that introducing a gate to drain offset reduces the TFT leakage current and improves its on/off ratio. One such prior art TFT 1 is shown in FIG. 1. The TFT 1 contains an insulating substrate 2, a channel region 3 of a first conductivity type (i.e., P− or N−), a heavily doped source region 4 of a second conductivity type (i.e., N+ or P+), a heavily doped drain region 5 of a second conductivity type (i.e., N+ or P+), a gate insulating layer 6 and a gate electrode 7. The TFT 1 also contains lightly doped source 8 and drain 9 regions (often called LDD or offset regions) of the second conductivity type (i.e., N− or P−). The LDD regions 8 and 9 are located between the channel region 3 and the heavily doped source 4 and drain 5 regions. Thus, the heavily doped drain region 5 is offset from the gate 7 by the lightly doped offset or LDD region 9.

However, since the source 4 and drain 5 regions are offset in the lateral dimension (i.e., parallel to the surface of the substrate 2), the TFT 1 effective area is increased because the TFT 1 takes up a larger area on the substrate 2 surface. Thus, the improvement in the TFT leakage current and on/off ratio comes at the expense of device density on the substrate. The decreased device density increases the device cost, since fewer devices can be made on each substrate.

BRIEF SUMMARY OF THE INVENTION

A preferred embodiment of the present invention provides a completed semiconductor device, comprising a substrate having an upper first surface, a semiconductor channel region of a first conductivity type over the first surface, a gate electrode, a gate insulating layer between the gate electrode and the channel region, a heavily doped semiconductor source region of a second conductivity type, a heavily doped semiconductor drain region of a second conductivity type, and an intrinsic or lightly doped semiconductor drain offset region located between the drain region and the channel region, such that the drain region is offset from the channel region at least partially in a direction perpendicular to the first surface.

Another preferred embodiment of the present invention provides a completed array of thin film transistors, comprising (a) a substrate and (b) a first plurality rails disposed at a first height above the substrate in a first direction, wherein each of the first plurality of rails comprises a heavily doped semiconductor source line of a first conductivity type. The array further comprises (c) a second plurality rails disposed at the first height above the substrate in the first direction, wherein said second plurality of rails are interspersed with and spaced apart from the first plurality of rails, and wherein each of the second plurality of rails comprises a heavily doped semiconductor drain line of the first conductivity type and an intrinsic or a lightly doped semiconductor drain offset of the first conductivity type. The array further comprises (d) a third plurality of spaced-apart rail-stacks disposed at a second height different from the first height in a second direction different from the first direction, where each rail-stack comprises a semiconductor layer of a second conductivity type, a conductive film, and a charge storage film. A first surface of the semiconductor layer is in contact with the first and the second plurality of rails. The charge storage film is disposed between a second surface of the semiconductor layer and the conductive film.

Another preferred embodiment of the present invention provides a method of making a semiconductor device, comprising providing a substrate having an insulating upper first surface, forming a semiconductor channel region of a first conductivity type over the first surface, forming a gate insulating layer, forming a gate electrode such that the gate insulating layer is located between the gate electrode and the channel region, forming a heavily doped semiconductor source region of a second conductivity type, forming a heavily doped semiconductor drain region of a second conductivity type, and forming an intrinsic or lightly doped semiconductor drain offset region located between the drain region and the channel region, such that the drain region is offset from the channel region at least partially in a direction perpendicular to the first surface.

DETAILED DESCRIPTION OF THE PREFERRED EMBODIMENTS

The present inventor has realized that vertically offsetting the drain from the gate and the channel reduces the TFT leakage current and improves its on/off ratio without increasing the TFT effective area. Thus, if the drain is vertically rather than laterally offset from the channel and the gate, then the offset region does not take up any extra lateral area over the substrate. In order to provide the vertical drain to channel and gate offset, an intrinsic or lightly doped semiconductor drain offset region is provided between the drain region and the channel region, such that the drain region is offset from the channel region at least partially in a direction perpendicular to the surface of the substrate. As used herein, a "completed device" is any packaged or unpackaged device on which the fabrication process has been completed. A "completed device" excludes an in-process device, which for example requires further annealing steps to diffuse or activate dopants in a semiconductor layer.

Figure 1:
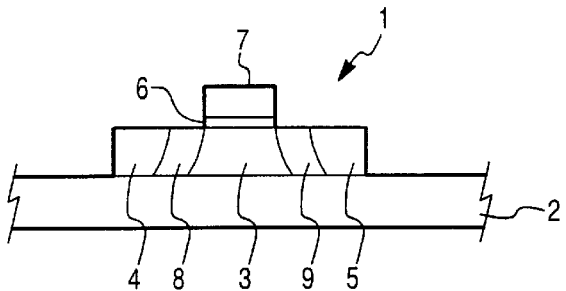
FIG. 1 is a side cross sectional view of a prior art TFT.
Figure 2:
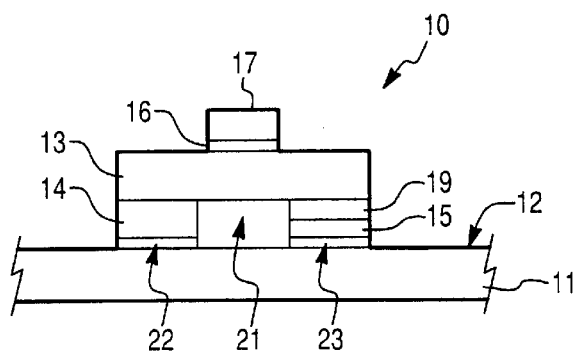
FIGS. 2–7 are side cross sectional views of TFTs according to the preferred embodiments of the present invention.

FIG. 2 illustrates a top gate staggered TFT 10 with a vertical drain offset according to the first preferred embodiment of the present invention. The TFT 10 contains a substrate 11 having an upper first surface 12. A lightly doped semiconductor channel region 13 of a first conductivity type (i.e., P− or N−) is located over the first surface 12. A heavily doped semiconductor source region 14 of a second conductivity type (i.e., N+ or P+) is located between the substrate 11 and the channel region 13. A heavily doped semiconductor drain region 15 of a second conductivity type (i.e., N+ or P+) is also located between the substrate 11 and the channel region 13. A gate electrode 17 is located above the channel 13. A gate insulating layer 16 is located between the gate electrode 17 and the channel region 13. Thus, the TFT 10 is of a top gate staggered type since the gate 17 is located above the channel 13 and the source 14 and drain 15 regions are located below the channel 13.

The drain region 15 is offset from the channel region 13 in a vertical direction because an intrinsic or lightly doped semiconductor drain offset region 19 of a second conductivity type (i.e., N− or P−) is located between the drain region 15 and the channel region 13. In this embodiment, the drain region 15 is offset from the channel region 13 in a direction perpendicular to the upper surface 12 of the substrate 11. Furthermore, the gate electrode 17 is also vertically offset from the drain region 15 due to the presence of the drain offset region 19 (i.e., the gate 17 is offset from the drain 15 at least partially in a direction perpendicular to the top surface 12 of the substrate 11).

The top surface 12 of the substrate 11 preferably comprises an insulating surface. Thus, the top surface 12 may comprise a top surface of an insulating layer, such as silicon dioxide, silicon oxynitride, silicon nitride or aluminum oxide, formed over a semiconductor substrate, such as a monocrystalline silicon or a gallium arsenide substrate. Alternatively, the top surface 12 may comprise a top surface of an insulating layer, such as silicon dioxide, silicon oxynitride, silicon nitride or aluminum oxide, formed over an insulating substrate, such as a glass, quartz, plastic or ceramic substrate. Alternatively, the top surface 12 may also comprise a top surface of an insulating substrate, such as a glass, quartz, plastic or ceramic substrate.

The channel region 13 preferably comprises a polysilicon or an amorphous silicon layer. This layer may be patterned into discrete islands, each containing one TFT channel, or this layer may comprise a continuous layer containing a plurality of TFT channels. The source region 14 preferably comprises a heavily doped polysilicon layer located below a first portion of the channel region 13. The drain region 15 preferably comprises a heavily doped polysilicon layer located below a second portion of the channel region. The drain offset region 19 preferably comprises a polysilicon layer located between the channel region 13 and the drain region 15.

Preferably, an optional planarized insulating fill layer 21, such as a silicon dioxide, silicon oxynitride, silicon nitride, spin-on glass, BPSG, PSG or BSG layer, is located between the source region 14 and the drain region 15. Preferably, a first metal or a metal silicide layer 22 is in contact with the source region 14, and a second metal or a metal silicide layer 23 is in contact with the drain region 15. The metal may comprise aluminum, copper, tungsten or titanium (including titanium nitride). The metal silicide may comprise any silicide, such as titanium, tungsten, cobalt, platinum or nickel silicide. The metal or metal suicide layers 22, 23 act as source and drain electrodes. Layers 22 and 23 may be located below the source 14 and drain 15 regions, buried within the source 14 and drain 15 regions and/or in contact with the sidewalls of the source 14 and drain 15 regions.

In FIG. 2, the gate insulating layer 16 and the gate electrode 17 are shown as being located adjacent to a middle portion of the channel region 13. However, if desired, the gate insulating layer 16 and the gate electrode 17 may extend above an entire length of the channel region 13.

Figure 3:
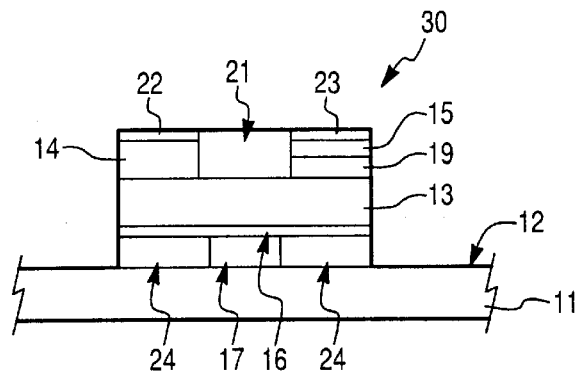

FIG. 3 illustrates a bottom gate staggered TFT 30 with a vertical drain offset according to the second preferred embodiment of the present invention. The bottom gate TFT 30 is the same as the top gate TFT 10, except that the gate insulating layer 16 and the gate electrode 17 are located below the channel region 13, while the source 14, drain 15 and the drain offset 19 regions are located above the channel region. Thus, in the TFT 30 of FIG. 3, the drain offset region 19 is located on the channel region 13, while the drain region 15 is located on the drain offset region 19. An optional insulating fill layer 24 may be formed between the channel region 13 and the substrate 11. All other elements of TFT 30 are the same as the elements of TFT 10, and are not further described to avoid redundancy.

In FIG. 3, the gate insulating layer 16 and the gate electrode 17 are shown as being located adjacent to a middle portion of the channel region 13. However, if desired, the gate insulating layer 16 and the gate electrode 17 may extend below an entire length of the channel region 13.

Of course, if desired, a coplanar top gate or bottom gate TFT with a vertically offset drain region may also be formed. A coplanar TFT differs from a staggered TFT in that the gate electrode and the source and drain regions are formed on the same side of the channel region. Thus, if desired, the gate electrode, the gate insulating layer, the source and drain regions and the drain offset region may all be formed above the channel region to form a coplanar top gated TFT. Alternatively, if desired, the gate electrode, the gate insulating layer, the source and drain regions and the drain offset region may all be formed below the channel region to form a coplanar bottom gated TFT. Furthermore, if desired, the gate electrode and one of a source and drain regions may be formed on one side of the channel, while the other one of the source and drain regions may be formed on the other side of the channel, to form a "semi-staggered" TFT.

Figure 4:
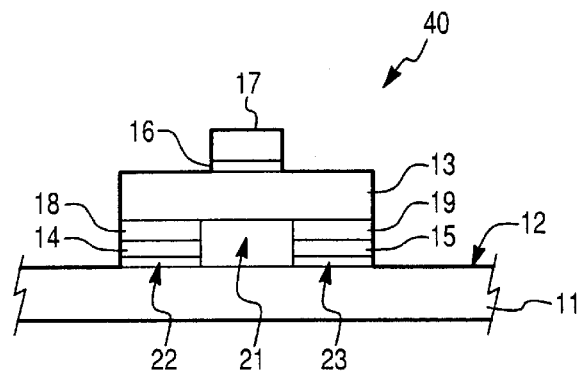

FIG. 4 illustrates a top gate staggered TFT 40 where both the source and the drain regions are offset from the channel in a vertical direction, according to the third preferred embodiment of the present invention. Thus, the TFT 40 contains both a source offset region 18 and a drain offset region 19. A TFT with a source and a drain offset region is sometimes referred to as an LDD TFT, where "LDD" actually stands for "lightly doped drain". The TFT 40 of FIG. 4 is the same as TFT 10 shown in FIG. 2, except that an additional source offset region 18 is located between the source region 14 and the channel region 13. The source offset region may be an intrinsic or lightly doped semiconductor region of a second conductivity type (i.e., N− or P− polysilicon).

The source region 14 is offset from the channel region 13 in a vertical direction because the source offset region 18 is located between the source region 14 and the channel region 13. In this embodiment, the source region 14 is offset from the channel region 13 in a direction perpendicular to the upper surface 12 of the substrate 11. Furthermore, the gate electrode 17 is also vertically offset from the source region 14 due to the presence of the source offset region 18 (i.e., the gate 17 is offset from the source 14 at least partially in a direction perpendicular to the top surface 12 of the substrate 11).

Figure 5:
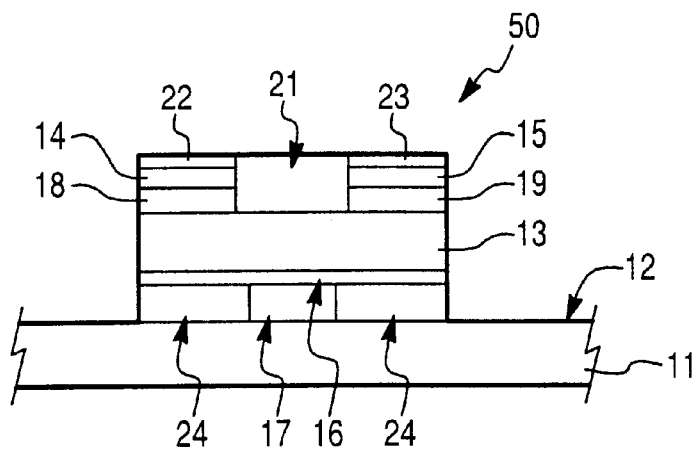

FIG. 5 illustrates a bottom gate staggered TFT 50 containing both source and drain offset regions according to the fourth preferred embodiment of the present invention. The bottom gate TFT 50 is the same as the top gate TFT 40, except that the gate insulating layer 16 and the gate electrode 17 are located below the channel region 13, while the source 14, drain 15 and the offset regions 18, 19 are located above the channel region. All other elements of TFT 50 are the same as the elements of TFT 40, and are not further described to avoid redundancy.

Figure 6:
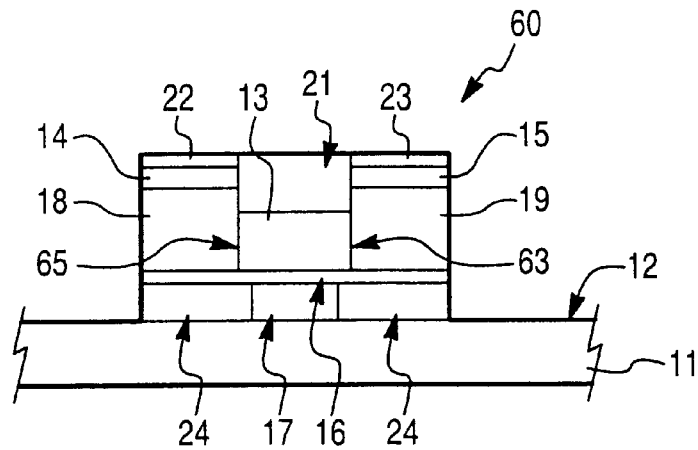

FIG. 6 illustrates a bottom gate staggered TFT 60 according to the fifth preferred embodiment of the present invention. The TFT 60 differs from TFT 50 in that the drain region 15 is offset from the channel region 13 in both parallel and perpendicular directions to the top surface 12 of the substrate 11. As shown in FIG. 6, the drain region 15 comprises a polysilicon layer located above and laterally spaced from a first lateral edge or side 63 of the channel region 13. The drain offset region 19 comprises a polysilicon layer located between the first lateral edge or side 63 of the channel region 13 and the drain region 15. The drain offset region 19 contacts the first lateral edge or side 63 of the channel region 13.

If the optional source offset region 18 is also present in the TFT 60, then the source region 14 is also offset from the channel region 13 in both parallel and perpendicular directions to the top surface 12 of the substrate 11. In this case, the source region 14 comprises a polysilicon layer located above and laterally spaced from a second lateral edge or side 65 the channel region 13. The source offset region 18 comprises a polysilicon layer located between the second lateral edge or side 65 of the channel region 13 and the source region 14. The source offset region 18 contacts the second lateral edge or side 65 of the channel region 13. All other elements of TFT 60 are the same as the elements of TFT 50, and are not further described to avoid redundancy. It should be noted that the drain region 15 may be offset from the channel region 13 in both parallel and perpendicular directions to the top surface 12 of the substrate 11 in a top gated TFT, such as TFT 10 of FIG. 2, rather than in a bottom gated TFT 60.

Figure 7:
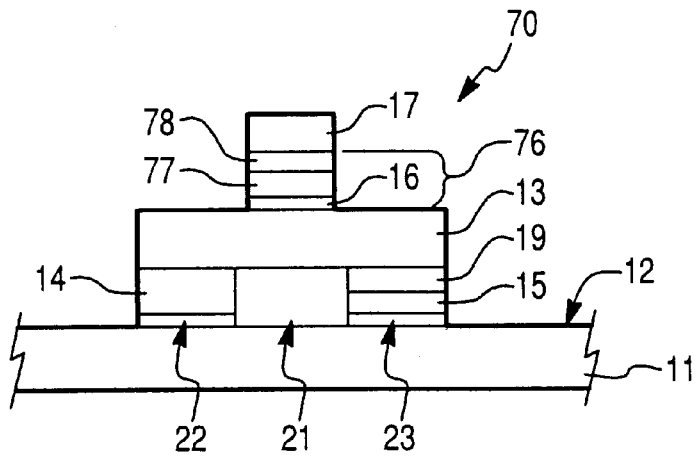

FIG. 7 illustrates a top gate staggered TFT 70 according to the sixth preferred embodiment. In this embodiment, the gate insulating layer 16 comprises a portion of a charge storage region 76, such that the TFT 70 comprises a nonvolatile memory device, such as an erasable programmable read only memory ("EPROM") or an electrically erasable programmable read only memory ("EEPROM"). The charge storage region 76 may comprise a dielectric isolated floating gate, an ONO dielectric film or an insulating layer containing conductive nanocrystals. The gate electrode 17 in a TFT EPROM or EEPROM is referred to as a control gate.

A dielectric isolated floating gate comprises a tunnel dielectric 16, such as a silicon oxide layer, in contact with the channel region 13, a polysilicon floating gate 77, and a control gate dielectric 78, (a.k.a. "interpoly dielectric") such as a silicon oxide layer or an ONO film. An ONO film charge storage region 76 comprises an oxide-nitride-oxide (ONO) dielectric triple layer. This dielectric comprises a tunnel oxide, a charge storage $Si_3N_{4-x}O_{1.5x}$ layer, where x is 0 to 1, and a blocking oxide. The tunnel oxide has a thickness of 1.5 nm to 7 nm, preferably 2.5 nm. The charge storage silicon nitride or silicon oxynitride ($Si_3N_{4-x}O_{1.5x}$) layer has a thickness of at least 4 nm, preferably 4–15 nm, most preferably 5 nm. The blocking oxide layer has a thickness of 3 nm to 9 nm, preferably 4.0 nm. The plurality of electrically isolated nanocrystals comprise silicon, tungsten or aluminum nanocrystals dispersed in a silicon oxide, nitride or oxynitride insulating layer. If a nanocrystal charge storage layer is used, then the tunnel and/or the blocking oxide layers are preferably omitted.

It should be noted that the gate insulating layer of a TFT of any previous embodiment may also comprise a portion of a charge storage region. Thus, TFTs 10, 30, 40, 50 and 60 may also comprise an EPROM or an EEPROM.

Preferably, a plurality of the TFTs of any of the previous preferred embodiment are arranged in an array. The array may comprise a plurality of TFTs used in a liquid crystal display (either in the driver or in the active matrix portion), in a logic device or in a memory device, such as an SRAM, a DRAM or a nonvolatile read only memory ("ROM"), such as a PROM (i.e., mask ROM), EPROM or EEPROM.

Most preferably, the array comprises a monolithic three dimensional array of nonvolatile memory devices. The term "monolithic" means that layers of each level of the array were directly deposited on the layers of each underlying level of the array. Thus, a first array of PROMs, EPROMs or EEPROMs is formed in a first semiconductor layer. Then, an interlayer insulating layer is formed over the first array of PROMs, EPROMs or EEPROMs. A second semiconductor layer is formed over the second interlayer insulating layer. A second array of PROMs, EPROMs or EEPROMs is formed in the second semiconductor layer to form a monolithic three dimensional array. Additional array levels may be formed in the same fashion if desired. In contrast, two dimensional arrays may be formed separately and then packaged together to form a non-monolithic memory device.

Figure 8:
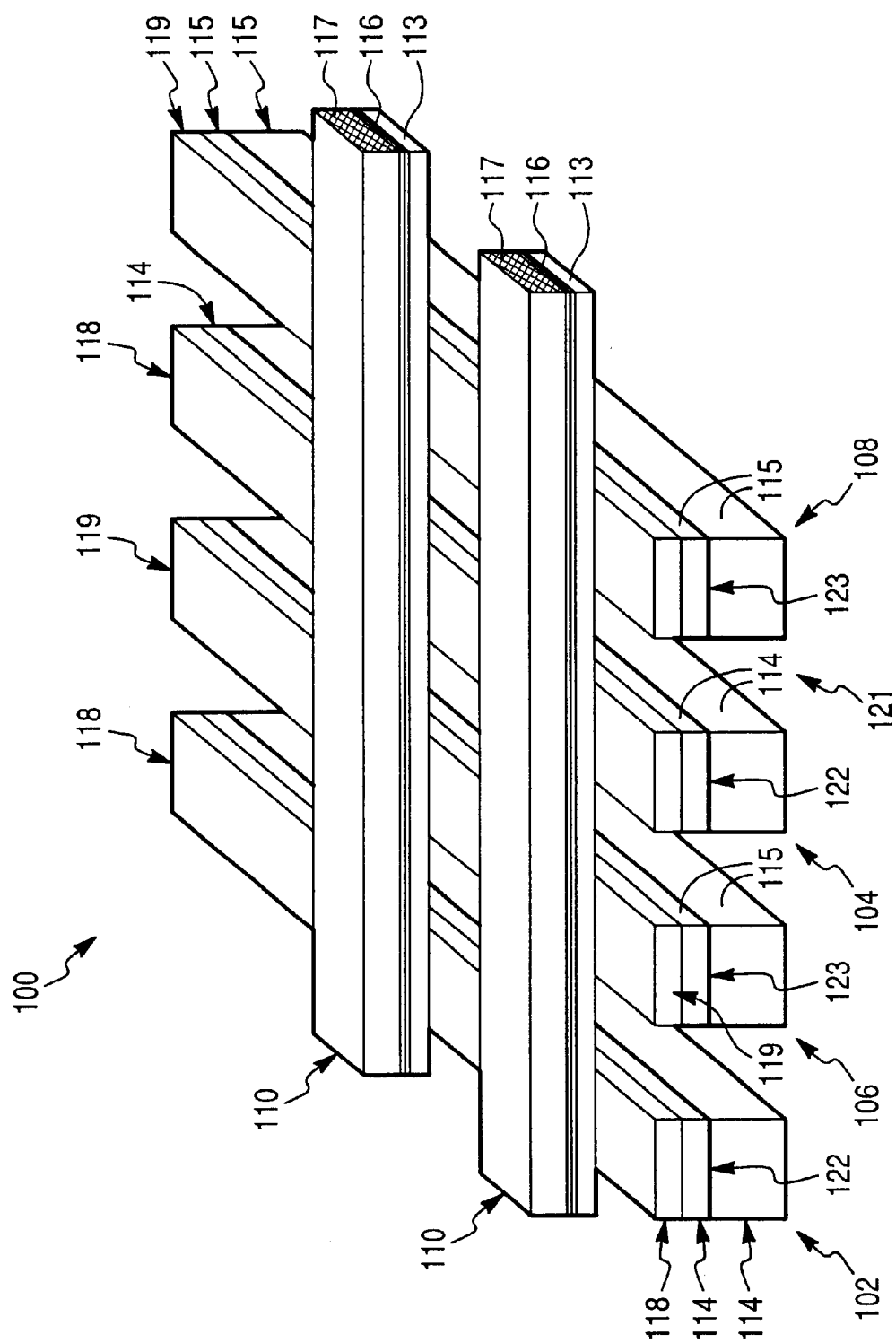
FIG. 8 is a three dimensional view of an array of the preferred embodiment of the present invention.

FIG. 8 illustrates one level of a monolithic three dimensional array of rail stack TFT EEPROMs according to the seventh preferred embodiment of the present invention. The array 100 is formed over a substrate (not shown in FIG. 8), which may be an interlayer insulating layer located over a monocrystalline silicon wafer containing various peripheral or driver circuits. A first plurality rails 102, 104 are disposed at a first height above the substrate in a first direction. Each of the first plurality of rails 102, 104 comprises a heavily doped semiconductor source (i.e., bit) line 114 of a second conductivity type (i.e., N+ or P+). Optionally, each of the first plurality of rails 102, 104 also comprises an intrinsic or lightly doped semiconductor source offset 118 of the second conductivity type (i.e., N− or P−)

A second plurality rails 106, 108 are disposed at the first height above the substrate in the first direction. The second plurality of rails 106, 108 are interspersed with and spaced apart from the first plurality of rails 102, 104. Each of the second plurality of rails 106, 108 comprises a heavily doped semiconductor drain (i.e., bit) line 115 of the second conductivity type and an intrinsic or lightly doped semiconductor drain offset 119 of the second conductivity type (i.e., N− or P−). Preferably, the rails 102, 104, 106, 108 comprise polysilicon. Of course, the source lines and drain lines are interchangeable, depending on the voltages applied to a particular line.

A third plurality of spaced-apart rail-stacks 110 are disposed at a second height different from the first height in a second direction different from the first direction. Each third rail-stack 110 comprises a semiconductor layer of a first conductivity type 113 (i.e., P− or N−), a conductive film 117 and a charge storage film 116. A first surface (bottom surface in FIG. 8) of the semiconductor layer 113 is in contact with the first 102, 104 and the second 106, 108 plurality of rails. The charge storage film 116 is disposed between a second surface (top surface in FIG. 8) of the semiconductor layer 113 and the conductive film 117. The conductive film 117 comprises a gate line (i.e., word line).

Figure 11:
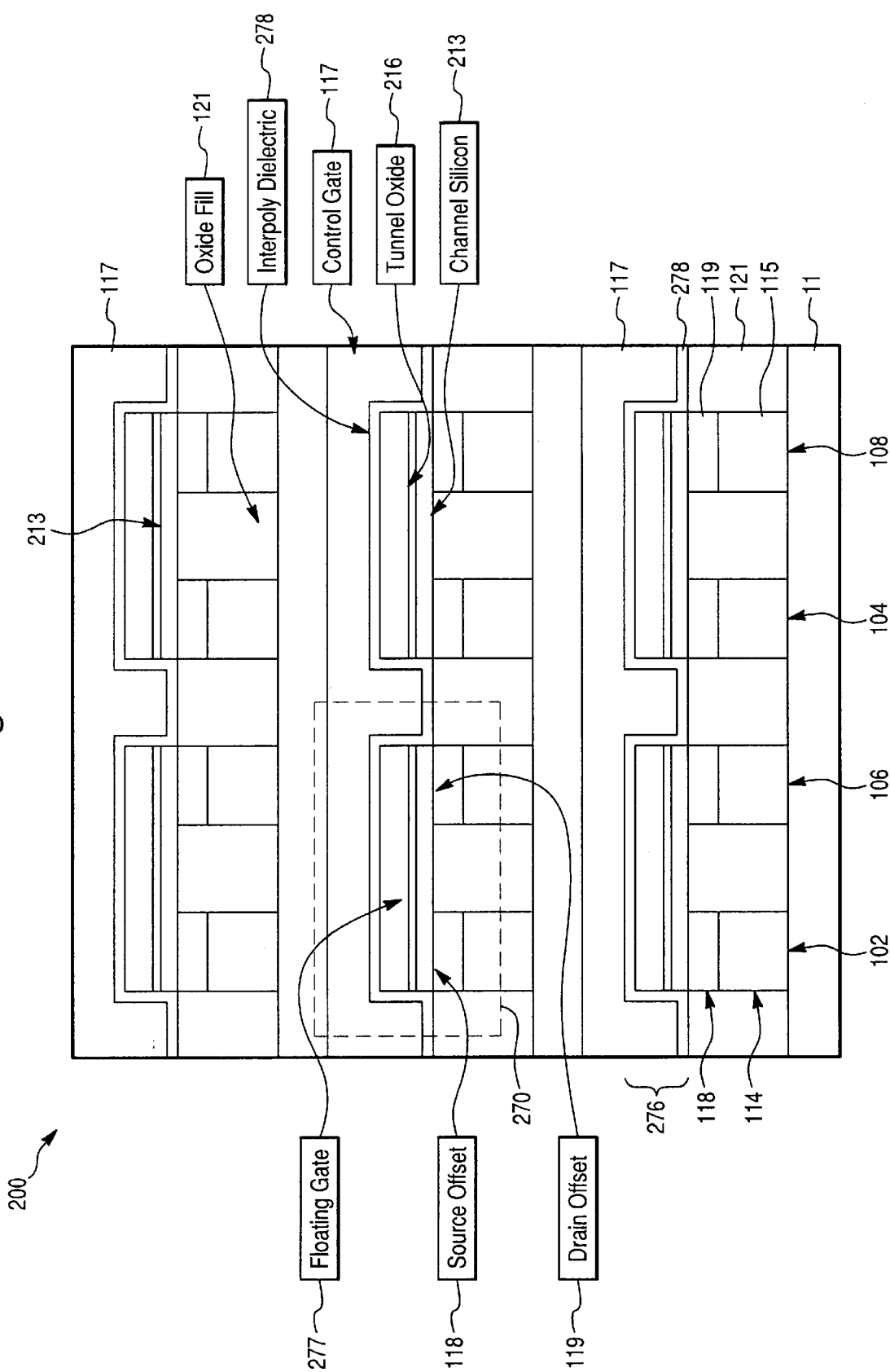

Preferably, the semiconductor layer 113 comprises polysilicon, but may comprise amorphous silicon if desired. The charge storage film 116 may comprise a dielectric isolated floating gate, an ONO dielectric film or an insulating layer containing conductive nanocrystals, as in the previous embodiment. If the charge storage film 116 comprises a dielectric isolated floating gate, then this floating gate is preferably also laterally isolated, as shown in FIG. 11, for example. The conductive film 117 preferably comprises a polysilicon layer of a first or a second conductivity type and an overlying metal silicide layer. Alternatively, the conductive film 117 may comprise a metal silicide layer between two polysilicon layers of a first or a second conductivity type, or one or more of any other layers of conductive material.

Preferably, a planarized insulating fill layer 121, such as a silicon dioxide, silicon oxynitride, silicon nitride, spin-on glass, BPSG, PSG or BSG layer, is located between the adjacent first and the second rails. Preferably, optional metal or a metal silicide layers 122, 123 are located in contact with the source 114 and drain 115 lines. The metal may comprise aluminum, copper, tungsten or titanium (including titanium nitride). The metal silicide may comprise any silicide, such as titanium, tungsten, cobalt, platinum or nickel silicide. The metal or metal silicide layers increase the conductivity of the source and drain lines. These metal or metal silicide layers may be located below the source 114 and drain 115 lines and/or in contact with the sidewalls of the lines 114, 115. If desired, these layers 122, 123 may be located inside the source 114 and drain 115 lines as shown in FIG. 8. In this case, a first portion of the source and drain lines are located above the metal or metal silicide layers and a second portion of the source and drain lines are located below the metal or metal silicide layers.

Each TFT EEPROM of the array 100 is located at each intersection of the third rail-stack 110 with the first (102) and the second (106) rails. Thus, in the embodiment of FIG. 8, a plurality of top gate staggered TFT EEPROMs 70 that are similar to the TFT EEPROMs of FIG. 7 are formed. Each TFT 70 comprises a portion of the source line 114 as a source region 14, a portion of the drain line 115 as a drain region 15, and a portion of the drain offset 119 as a drain offset region 19. Optionally, a portion of the source offset 118 is a source offset region 18 of each TFT 70. A portion of the semiconductor layer 113 between the first rail 102 and an adjacent second rail 106 is a channel region 13 of the TFT 70. A portion of the conductive film 117 above the channel region 13 is the gate electrode 17 of the TFT 70, as shown in FIG. 9.

Figure 9:
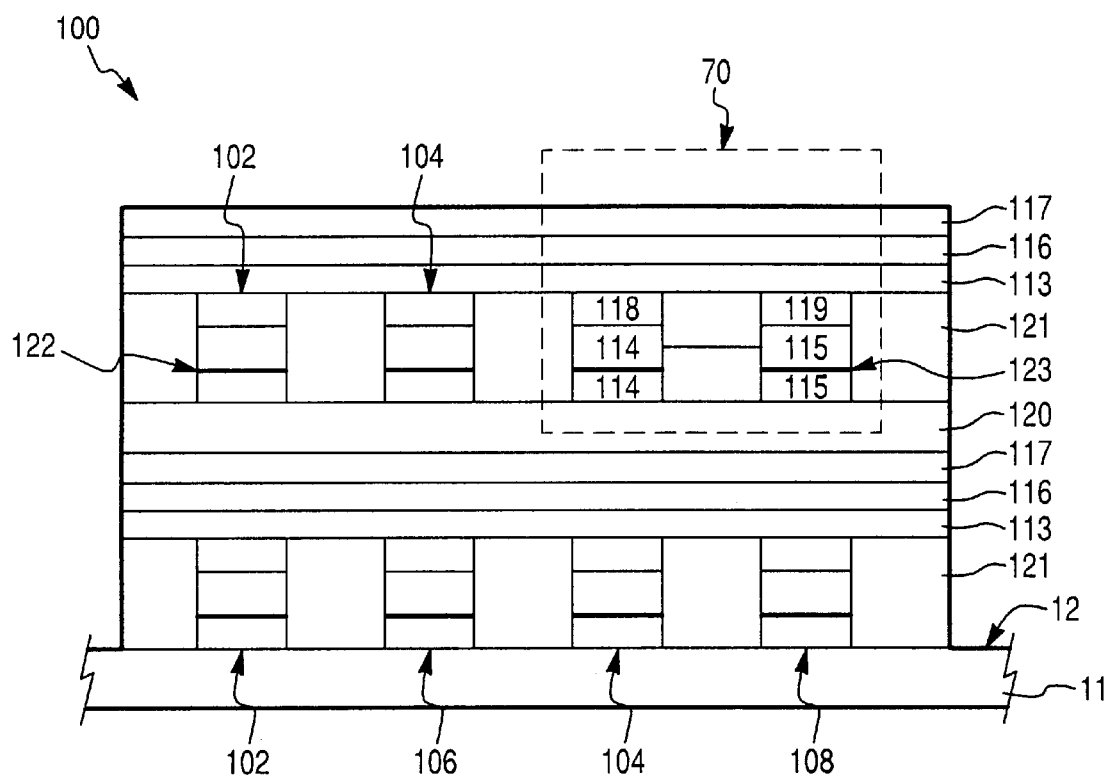
FIGS. 9–11 are side cross sectional views of arrays of the preferred embodiments of the present invention.

The memory array structure of FIG. 8 can be easily extrapolated to three dimensions, as shown in FIG. 9. To do this, an interlayer insulating layer 120 is placed over the third rail-stacks 110. This layer 120 prevents shorting one set of gate lines or word lines with the next set of bit lines (i.e., source or drain lines). Then another layer of first and second rails is constructed over the interlayer insulating layer followed by forming a filler insulating layer followed by a deposition of another set of third rail-stacks. This process can be repeated a number of times, as desired, to form two or more device levels (such as eight levels, for example).

Furthermore, in the eighth preferred embodiment, the array 100 may be formed to contain bottom gate staggered TFT EEPROMs, such as those illustrated in FIGS. 3, 5 and 6 rather than top gated staggered TFT EEPROMs 70. In this case, the order of formation of the rails is reversed, and the plurality of third rail-stacks 110 are formed below the plurality of the first 102, 104 and the second 106, 108 rails in each device level.

Figure 10:
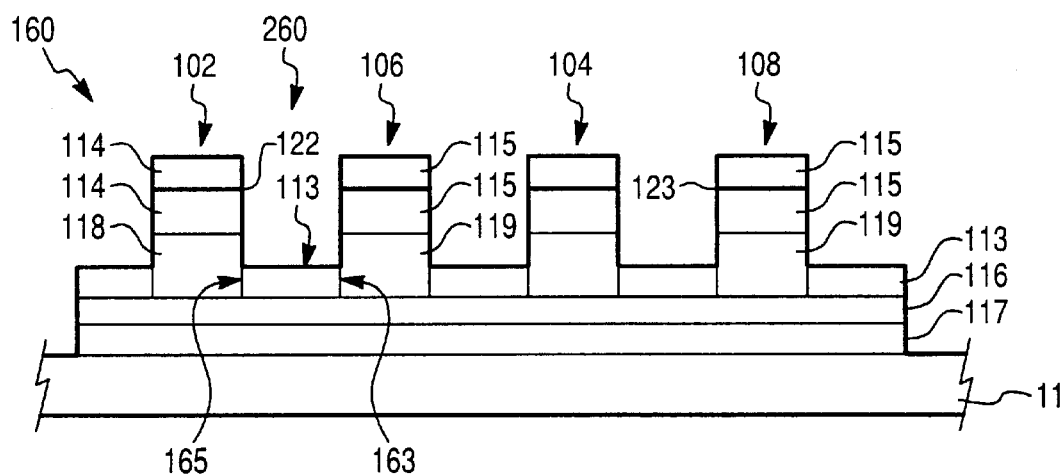

FIG. 10 illustrates an array 160 according to the ninth preferred embodiment of the present invention. The array 160 contains a plurality of bottom gate staggered TFT EEPROMs 260 according to the ninth preferred embodiment of the present invention. The TFT EEPROMs 260 are similar to TFTs 60 illustrated in FIG. 6, in that the drain region 115 is offset from the channel region 113 in both parallel and perpendicular directions to the top surface of the substrate 11. Thus, the source region 114 is located above and laterally spaced from a first portion of the channel region 113. The drain region 115 is located above and laterally spaced from a second portion of the channel region 113. The drain offset region 119 is located between the channel region 113 and the drain region 115, and contacts a first lateral edge 163 of the channel region 113. The optional source offset region 118 is located between the channel region 113 and the source region 114, and contacts a second lateral edge 165 of the channel region 113. Of course, a three dimensional monolithic array may comprise both top gate and bottom gate TFTs, such as having one level of the array containing top gate TFTs and another level of the array containing bottom gate TFTs.

The memory devices of the preferred embodiments of the present invention may be arranged in a three dimensional virtual ground array (VGA) nonvolatile flash memory. For example, array 100 of FIG. 8 is arranged as a VGA. The devices may also be formed in nonvolatile flash memory architectures other than VGA, such as NOR-type memory, Dual String NOR (DuSNOR) or Separated Source Line NOR (see I. Fujiwara et al., Japan J. Appl. Phys., vol. 39, pp. 417–423, February 2000, incorporated herein by reference) memory architectures.

In a VGA illustrated in the previous embodiments, the programming of each EEPROM occurs by hot carrier injection. In hot carrier injection, a voltage is placed across a diode (i.e., between a source and a drain of a TFT EEPROM). The hot carriers (i.e., hot electrons or holes) that are travelling from source to drain through the channel of the TFT EEPROM are injected into the charge storage region which is disposed adjacent to the channel. This procedure is a relatively high power event.

For low power portable applications where both program/ erase and read power are important, a flash nonvolatile memory using Fowler-Nordheim tunneling ("FN tunneling") for both program and erase may be used. FN tunneling results from applying a voltage across a dielectric. Thus, in a TFT EEPROM, a voltage is applied between a control gate and a source and/or a drain region of the TFT, for writing and erasing the TFT EEPROM. This is in contrast with hot carrier injection programming, where a voltage is applied between the source and the drain regions.

Thus, in tenth preferred embodiment of the present invention, charge storage devices, such as TFT EEPROMs, are arranged in a flash memory array configuration which utilizes FN tunneling programming. The VGA is not compatible with FN tunneling since the whole channel polysilicon inverts along the length of the pulsed-high word (i.e., gate) line and will then program cells in addition to the one that needs programming. Therefore, the FN tunneling rail stack (crosspoint) flash array differs from the VGA in that in the FN tunneling array, the active polysilicon layer is patterned into polysilicon islands to allow FN tunneling programming, as shown in FIG. 11. Thus, an extra photolithographic masking step is added to the process of making the rail stack array shown in FIG. 11 during which the polysilicon active layer is etched into islands 213 in each device cell. The same photoresist mask can be used to define (i.e., etch) the charge storage regions 216 in each cell.

FIG. 11 illustrates an array 200, where each charge storage region 276 of each TFT EEPROM 270 contains a floating gate 277 between a tunnel dielectric 216 and a control gate dielectric 278. If desired, the floating gate 277 may be made from hemispherical grain polysilicon which has a textured surface to maximize the control gate to floating gate coupling. Alternatively, the coupling may be increased by increasing the floating gate height, by forming horns or protrusions in the floating gate, or by roughening the floating gate surface. Of course, ONO and dielectrically isolated nanocrystals may be used instead of the floating gate. All other elements of the array 200 are the same as the elements of array 100 of FIGS. 8 and 9 (except that they are prefixed by "2" rather than "1") and are not further described to avoid redundancy. Of course, the TFT EEPROMs 270 of the array 200 may be bottom gated rather than top gated and may lack a source offset region 118, if desired.

FIGS. 2–11 illustrate completed rather than in-process TFTs and TFT arrays. These TFT and arrays may be made by any desired method. For example, the TFTs may be made by the following method. A substrate 11 having an insulating upper first surface 12 is provided. A semiconductor channel region 13 of a first conductivity type is formed over the first surface 12. A gate insulating layer 16 is formed. A gate electrode 17 is formed such that the gate insulating layer 16 is located between the gate electrode 17 and the channel region 13 A heavily doped semiconductor source region 14 of a second conductivity type is formed. A heavily doped semiconductor drain region 15 of a second conductivity type is formed. An intrinsic or lightly doped semiconductor drain offset region 19 is formed such that it is located between the drain region 19 and the channel region 13. If desired, an optional intrinsic or lightly doped semiconductor source offset region 18 is formed, such that the source offset region 18 is located between the source region 14 and the channel region 15. These steps may be carried out in several different sequences to form top or bottom gated TFTs, as will be described in more detail below.

Figure 12A:
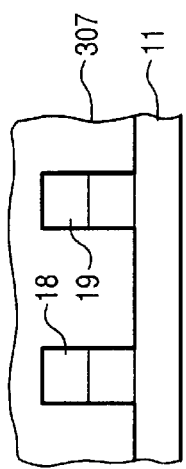
FIGS. 12A–17D are side cross sectional views of steps in the methods of making TFTs of the preferred embodiments of the present invention.

FIGS. 12A–G illustrate a preferred method of making the top gated staggered TFT 40 of the third preferred embodiment. As shown in FIG. 12A, a heavily doped first polysilicon layer 301 of the second conductivity type is formed over the substrate 11. The polysilicon layer 301 may be a N+ or a P+ layer having a doping concentration between $10^{19}$ and $10^{21}$ cm$^{-3}$. An intrinsic or lightly doped second polysilicon layer 303 of the second conductivity type is formed on the first polysilicon layer 301. The polysilicon layer 303 may be an intrinsic or a N– or a P– layer having a doping concentration between $10^{15}$ and $10^{18}$ cm$^{-3}$. A photoresist mask 305 is formed over the second polysilicon layer 303.

Figure 12B:
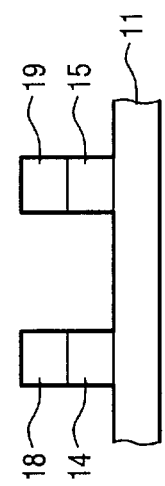

As shown in FIG. 12B, the first 301 and the second 303 polysilicon layers are patterned (i.e., etched) using the first mask 305. The first polysilicon layer 301 is patterned to form the source 14 and the drain 15 regions. The second polysilicon layer is patterned to form the source offset region 18 over the source region 14 and to form the drain offset region 19 over the drain region 15.

Figure 12C:
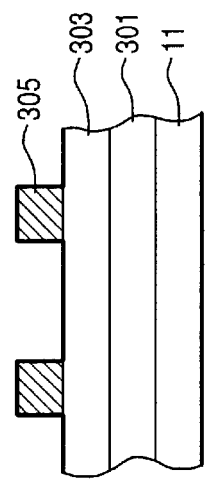
Figure 12D:
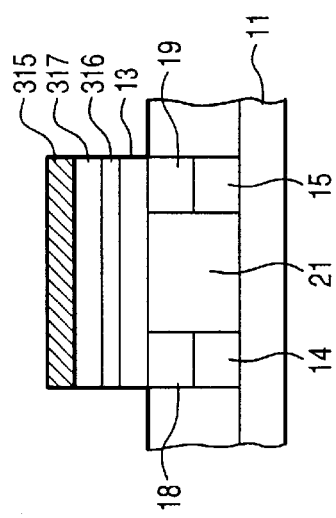

As shown in FIG. 12C, after the patterning of layers 301 and 303 and after the mask 305 is removed, an insulating layer 307 (such as a silicon dioxide layer) is formed over the offset regions 18 and 19. The insulating layer 307 is planarized by chemical mechanical polishing using the source and drain offset regions as a polish stop, such that the polished insulating fill layer 21 is formed between the source and the drain regions, and the top surface of the offset regions is exposed, as shown in FIG. 12D.

Figure 12E:
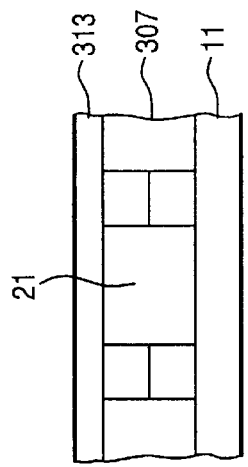
Figure 12F:
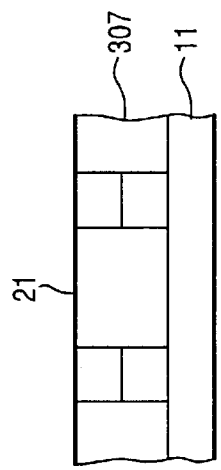

As shown in FIG. 12E, a third polysilicon layer 313 of a first conductivity type is formed over the source and drain offset regions 18, 19 and the polished insulating fill layer 21. The polysilicon layer 313 may be a P– or a N– layer having a doping concentration between $10^{16}$ and $10^{18}$ cm$^{-3}$. As shown in FIG. 12F, an insulating layer 316 is formed over the third polysilicon layer 313. A conductive film 317 is formed over the insulating layer 316. The insulating layer 316 may be a silicon oxide, a silicon nitride and/or a silicon oxynitride layer. The conductive film may be a stack comprising an N+ or P+ polysilicon layer and a metal silicide layer, such as a titanium silicide layer. Then a second photoresist mask 315 is formed over the conductive film 317, the insulating layer 316 and the third polysilicon layer 313. The third polysilicon layer 313 is patterned using the second photoresist mask 315 to form a channel region 13 in contact with the source and drain offset regions, as shown in FIG. 12F. Layer 316 and film 317 are patterned as well.

Figure 12G:
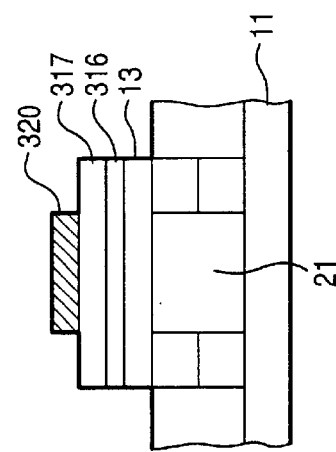

A third photoresist mask 320 is formed over film 317 and layer 316, as shown in FIG. 12G. The layer 316 and film 317 are then patterned form a gate insulating layer 16 and a gate electrode 17, as shown in FIG. 4. The optional metal or metal silicide layers 22, 23 shown in FIG. 4 may be formed by patterning a metal or metal silicide layer during the first patterning step. Thus, the TFT 40 shown in FIG. 4 is completed. Alternatively, mask 315 may be formed on the third polysilicon layer 313 shown in FIG. 12E, and the polysilicon layer 313 is then patterned to form the channel region 13. Layer 316 and film 317 are then formed on the channel region 13. Mask 320 is then used to pattern layer 316 and film 317 to form a gate insulating layer 16 and a gate electrode 17.

Figure 13B:
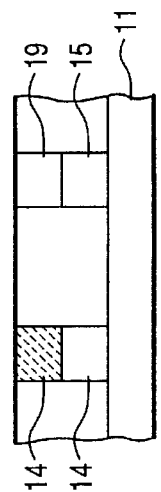
Figure 13A:
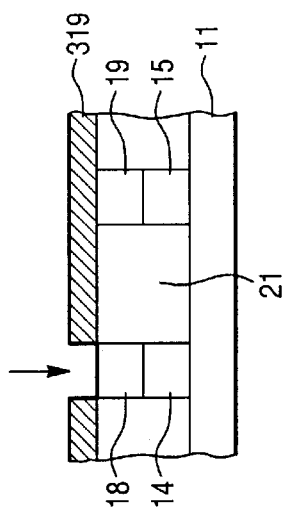

To form the top gate staggered TFT 10 of the first preferred embodiment, the process shown in FIGS. 12A–G is slightly modified. The second polysilicon layer 303 is patterned to form the source 18 and drain 19 offset regions, and the insulating fill layer 21 is formed between the source 14 and drain 15 regions, as shown in FIGS. 12A–D. An extra photoresist mask 319 is selectively formed over the drain offset region 19 and the polished insulating fill layer 21, while exposing the source offset region 18, as shown in FIG. 13A. Using the mask 319, ions of a second conductivity type are selectively implanted into the source offset region 18 to convert the source offset region 18 into a heavily doped upper portion of the source region 14 of the second conductivity type, as shown by cross hatching in FIG. 13B. In the example described above, if the source region 14 comprises an N+ region, then the source offset region 18 may be doped with phosphorus, arsenic and/or antimony ions such that the region 318 has a doping concentration of $10^{19}$ and $10^{21}$ cm$^{-3}$. If the source region 14 comprises a P+ region, then boron or BF$_2$ ions may be implanted into region 18 instead. The method then proceeds as shown in FIGS. 12E–G to form the TFT 10 shown in FIG. 2.

Figure 14C:
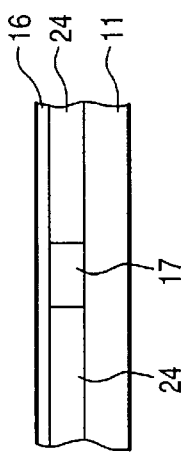
Figure 14F:
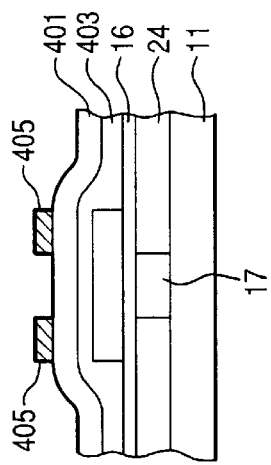
Figure 14B:
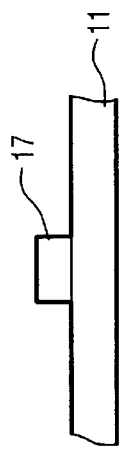
Figure 14E:
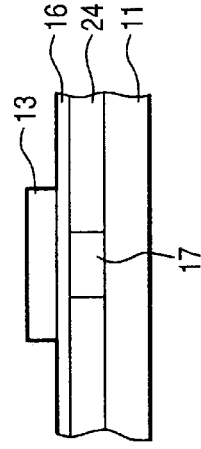
Figure 14A:
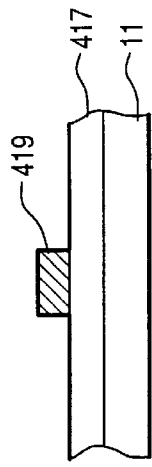

FIGS. 14A–H illustrate a preferred method of making the bottom gate staggered TFT 50 of the fourth preferred embodiment. As shown in FIG. 14A, a conductive film 417 is formed over the substrate 11. The conductive film 417 may be a stack comprising an N+ or P+ polysilicon layer and a metal silicide layer, such as a titanium silicide layer. Then, a first photoresist mask 419 is formed over the conductive film 417. The conductive film 417 is patterned using the mask 419 to form a gate electrode 17 as shown in FIG. 14B.

If desired, an optional first insulating layer 24 is formed adjacent to the gate 17 sidewalls, as shown in FIG. 14C. Layer 24 may be formed by the sidewall spacer method or by forming an insulating layer over the patterned gate 17 and planarizing the insulating layer by chemical mechanical polishing to expose the top portion of the gate 17. A gate insulating layer 16 is formed over the gate 17 and the first insulating layer 24, as shown in FIG. 14C. The gate insulating layer 16 may be a silicon oxide, a silicon nitride and/or a silicon oxynitride layer.

Figure 14D:
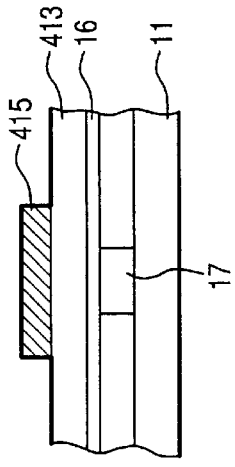

A third polysilicon layer 413 of a first conductivity type is then formed over the gate insulating layer 16, as shown in FIG. 14D. The polysilicon layer 413 may be a P− or a N− layer having a doping concentration between $10^{16}$ and $10^{18}$ cm$^{-3}$. A second photoresist mask 415 is formed over layer 413, and layer 413 is patterned to form a channel region 13, as shown in FIG. 14E.

An intrinsic or lightly doped second polysilicon layer 403 of the second conductivity type is formed over the channel region, as shown in FIG. 14F. The polysilicon layer 403 may be an intrinsic or a N− or a P− layer having a doping concentration between $10^{15}$ and $10^{18}$ cm$^{-3}$. A heavily doped first polysilicon layer 401 is then formed over the second polysilicon layer 403. The polysilicon layer 401 may be a N+ or a P+ layer having a doping concentration between $10^{19}$ and $10^{21}$ cm$^{-3}$.

Figure 14H:
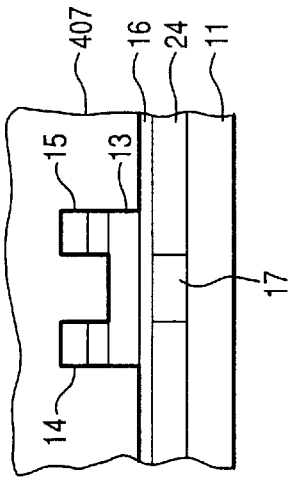
Figure 14G:
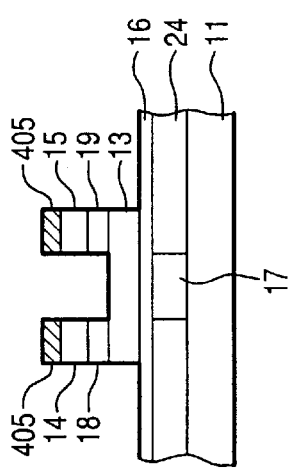

A third photoresist mask 405 is formed over layer 401. The first polysilicon layer 401 is patterned using mask 405 to form the source 14 and drain 15 regions. The second polysilicon layer 403 is then patterned to form a source offset region 18 below the source region 14 and a drain offset region 19 below the drain region 15, as shown in FIG. 14G. Preferably layer 401 and 403 are patterned during the same etching step using the same mask 405.

After the patterning of layers 401 and 403 and after the mask 405 is removed, a second insulating layer 407 (such as a silicon dioxide layer) is formed over and between the source 14 and drain 15 regions. The insulating layer 407 is planarized by chemical mechanical polishing using the source and drain regions as a polish stop, such that the polished insulating fill layer 21 is located between the source and the drain regions, to form the TFT 50 as shown in FIG. 5. If desired, the optional metal or metal silicide layers 22, 23 may be formed over the source 14 and drain 15 regions.

Figure 15C:
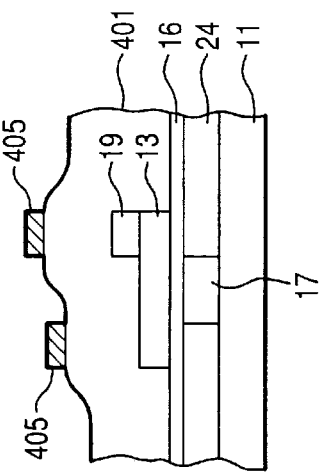
Figure 15B:
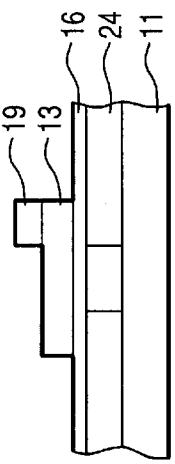
Figure 15A:
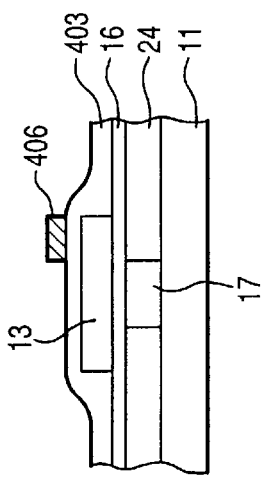

To form the bottom gate staggered TFT 30 of the second preferred embodiment, the process shown in FIGS. 14A–H is slightly modified. After the channel region 13 is formed in FIG. 14E, an intrinsic or lightly doped second polysilicon layer 403 of the second conductivity type is formed over the channel region 13. Prior to forming the first polysilicon layer 401, a fourth photoresist mask 406 is formed on the second polysilicon layer 403, as shown in FIG. 15A.

The second polysilicon layer 403 is then patterned to form the drain offset region 19, but not the source offset region 18 over the channel region 13. The fourth photoresist mask 406 is then removed, as shown in FIG. 15B.

Figure 15D:
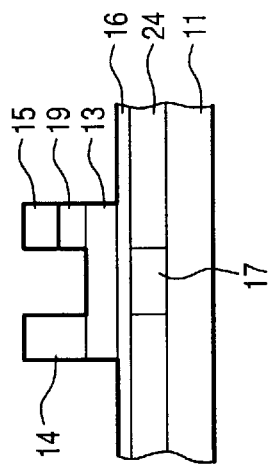

The first heavily doped polysilicon layer 401 is then formed on the drain offset region 19 and on the channel region 13. Layer 401 is preferably thicker than in FIG. 14F. A third photoresist mask 405 is formed over layer 401, as shown in FIG. 15C. The first polysilicon layer 401 is patterned using mask 405 to form the source region 14 on the channel region 13 and the drain 15 region on the drain offset region 19, as shown in FIG. 15D.

After the patterning of layer 401 and after the mask 405 is removed, the process proceeds as before. The second insulating layer 407 (such as a silicon dioxide layer) is formed over and between the source 14 and drain 15 regions, as shown in FIG. 14H. The insulating layer 407 is planarized by chemical mechanical polishing using the source and drain regions as a polish stop, such that the polished insulating layer 21 is located between the source and the drain regions.

If desired, the drain region 15 which protrudes higher than the source region 14 may also be planarized such that the source 14 and drain 15 regions extend to about the same height, to form the TFT 30 as shown in FIG. 3.

The method of making the bottom gate staggered TFT 60 of the fifth preferred embodiment is the same as the method of making TFTs 50 and 30 illustrated in FIGS. 14A–H and 15A–D, except that the order of polysilicon layer forming and patterning steps is reversed. The first 401 and the second 403 polysilicon layers are formed and patterned to form the source 14, the drain 15, the drain offset 19 and the optional source offset 18 regions (i.e., the source region 14 may be located on the source offset region 18 or directly on the gate insulating layer 16 if the source offset region 18 is omitted). Then, the third polysilicon layer 413 is deposited over the source region 14, the drain region 15 and the exposed portion of the gate insulating layer 16. The third polysilicon layer 413 is then patterned to form a channel region 13 that is located between the source 14 and the drain regions 15 on the gate insulating layer 16, as shown in FIG. 6.

The method of forming a TFT EEPROM 70 of the sixth preferred embodiment is the same as the methods described above, except that the gate insulating layer 16 is replaced with a charge storage region or film 76. Thus, instead of forming a gate insulating layer, a dielectric isolated floating gate, an ONO film or a dielectrically isolated nanocrystals are formed between the gate 17 and the channel region 13, as illustrated in FIG. 7.

In the above described methods of forming TFTs 10, 30, 40, 50, 60 and 70, the insulating fill layer 21 is formed after forming the source 14 and drain regions 15. However, in an alternative aspect of the present invention, the source 14 and drain 15 regions are formed after forming the insulating fill layer 21.

Figure 16C:
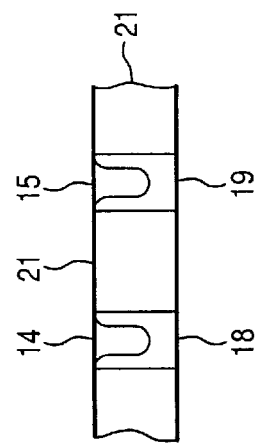
Figure 16B:
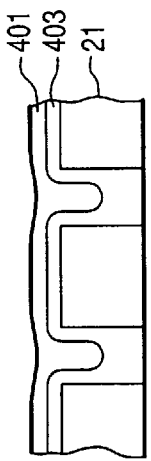
Figure 16A:

As shown in FIG. 16A, the insulating fill layer 21 is formed and patterned to form openings 25 for the source and drain regions. For example, the insulating fill layer 21 may be formed over the channel region 13 in a bottom gated TFT. Then, the second 403 and the first 401 polysilicon layers are formed over the insulating fill layer 21 and in the openings 25, as shown in FIG. 16B. The polysilicon layers 401 and 403 are then planarized by chemical mechanical polishing or by other means to form the source 14, the drain 15, the source offset 18 and the drain offset 19 regions in the openings 25, as shown in FIG. 16C. If it is desired to omit the source offset region 18, then an extra masking and etching step is added to pattern the second polysilicon layer 403 to form the drain offset region 19 but not the source offset region 18 before forming the first polysilicon layer 401.

In the above described methods, the heavily doped first polysilicon layer 401 was used to form the source 14 and drain 15 regions, while the intrinsic or lightly doped second polysilicon layer 403 was used to form the offset regions 18 and 19. However, in an alternative aspect of the present invention, the formation of the first polysilicon layer 401 may be omitted and the source 14 and drain 15 regions may be formed by ion implantation into the intrinsic or lightly doped second polysilicon layer 403.

Figure 17A:
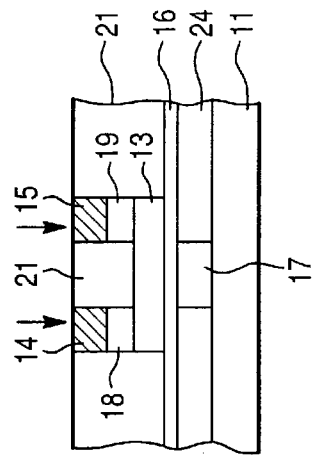
Figure 17B:
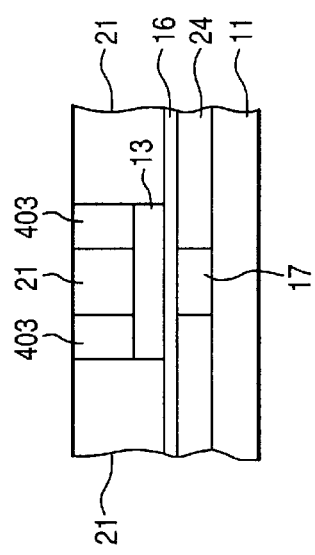

FIG. 17A illustrates a bottom gate staggered TFT containing a patterned lightly doped second polysilicon layer 403 over the channel region 13. The insulating fill layer 21 is located between portions of the patterned polysilicon layer 403. Then, a blanket ion implantation of ions of the second conductivity type (indicated by arrows in FIG. 17B) is carried out into the top portions of layer 403 and the insulating fill layer 21. The ions are implanted shallowly, such that the implant does not extend all the way to the bottom of layer 403. After an activation anneal, the implanted top portions of layer 403 (shown by cross hatching) are converted to heavily doped source 14 and drain 15 regions, while the lower portions of layer 403 form the intrinsic or lightly doped offset regions 18 and 19, as shown in FIG. 17B. Thus, no extra masking step is required for the ion implantation.

Figure 17C:
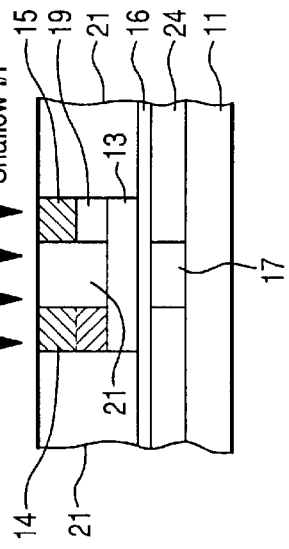
Figure 17D:
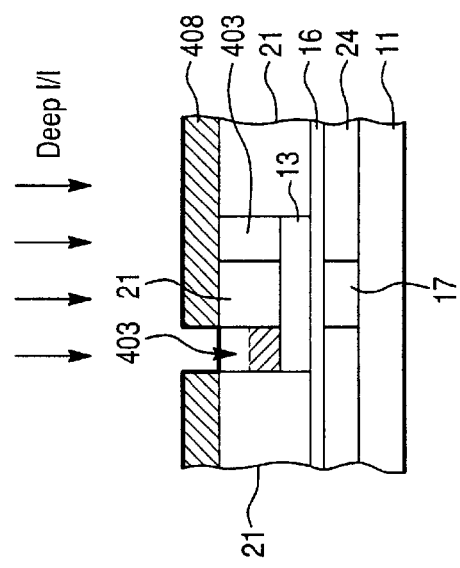

If it is desired to form only the drain offset region 19 but not the source offset region 18, then an extra masking step is required. First, a photoresist mask 408 is formed over the portion of layer 403 that will be the future drain region, and a deep ion implantation of ions of the second conductivity type is carried out into the unmasked first portions of layer 403, as shown by cross hatching in FIG. 17C. Then, the mask 408 is removed, and a shallow blanket ion implantation of ions of the second conductivity type is carried out into both exposed regions of layer 403, as shown by cross hatching in FIG. 17D. A shallow implant is carried out at a lower energy and/or with ions of lower mass than in the deep implant. After the activation anneal, the entire first portion of layer 403 is converted into a heavily doped source region 14. The top section of the second portion of layer 403 which has received only a shallow implant is converted into a drain region 15. A drain offset region 19 is formed in the bottom section of layer 403 that has not received an ion implant, as shown in FIG. 17D.

In the above described preferred embodiments, the use of polysilicon layers was described. However, amorphous silicon, single crystal silicon or non-silicon semiconductor materials may be used instead. The polysilicon layers described above may be deposited as polysilicon layers by chemical vapor deposition (CVD) or other methods. The semiconductor layers may be in-situ doped during deposition or these layers may be doped by ion implantation or diffusion after deposition. Furthermore, the polysilicon layers, such as the channel layer 13, may be first deposited as amorphous silicon layers and then crystallized to form polysilicon or single crystal silicon layers. The crystallization may be carried out by laser, flash lamp and/or thermal (i.e., furnace) annealing. If desired, a transition metal or germanium crystallization catalyst material may be placed in contact with the amorphous silicon layers to increase the polysilicon grain size after the crystallization. Such transition catalyst materials may comprise nickel, cobalt, platinum, palladium and other transition metals. The insulating and conductive layers described above may be deposited by any known method, such as CVD, sputtering, plating, spin-on coating (for spin-on glass), etc.

In the various embodiments described above, metal silicide layers 22, 23 were formed in contact with silicon layers, such as the polysilicon source and drain regions or gate electrodes. One preferred method of forming a metal silicide layer, such as a titanium silicide layer, in contact with a silicon layer is by using a silicon cap and a TiN layer. The titanium silicide layer is formed on an undoped amorphous silicon cap layer. The cap layer is formed on a heavily doped silicon layer, such as a polysilicon or amorphous silicon layer doped to a concentration in excess of $10^{19}$ cm$^{-3}$, such as $10^{19}$ cm$^{-3}$ to $10^{21}$ cm$^{-3}$. The cap layer is preferably deposited on P+ polysilicon or N+ amorphous silicon layers. The N+ amorphous silicon may then be recrystallized into N+ polysilicon during subsequent annealing steps.

A method of forming a titanium silicide (TiSi$_2$) layer comprises the following steps. A heavily doped polysilicon layer is deposited. For example, a P+ polysilicon layer is boron doped to a concentration of $5\times10^{20}$ cm$^{-3}$, and has a thickness of about 1400 Angstroms. A cap layer of undoped amorphous silicon is deposited on the P+ polysilicon layer. The cap may be 600 Angstroms thick, for example. A titanium layer is deposited on the cap. The titanium layer may be 250 Angstroms thick, for example. A titanium nitride layer is deposited on the titanium layer. The titanium nitride layer may be 100 Angstroms thick, for example. Other layer thicknesses may be used, as required.

The layers are annealed at a temperature below 650° C. for less than five minutes to react the titanium and the silicon in the cap to form a C49 phase TiSi$_2$ layer. The anneal may be carried out at 600° C. for 1 minute, for example. If desired, another P+ polysilicon layer is deposited over the stack and the stack is etched into a thin "wire" or "rail", such as a word line or bit line. The wire or rail may be 0.25 mm wide or less. The titanium silicide is then transformed from the C49 to the C54 phase by a high temperature (i.e., above 650° C.) anneal. The anneal can take place before or after the wires or rails are patterned, at 800° C. for one minute, for example. By annealing each Si/Ti/TiN film stack below 650° C., dopant diffusion and thermal grooving of the TiSi$_2$ is minimized. Multiple film stacks can be deposited and etched sequentially.

The methods of making TFTs illustrated in FIGS. 12–17 may be easily extrapolated to making the three dimensional monolithic arrays of TFTs of the seventh through tenths preferred embodiments illustrated in FIGS. 8–11.

For example, the following method may be used to make an array 100 of rail stack TFTs of the seventh preferred embodiment. In each level of the array 100, the gate 117 is formed above the channel 113, while the source 114 and drain 115 regions are formed below the channel (i.e., an array of top gate staggered TFTs is formed), as shown in FIG. 8. The process includes forming a heavily doped first polysilicon layer of the second conductivity type over the substrate and forming an intrinsic or a lightly doped second polysilicon layer of the second conductivity type over the first polysilicon layer, similar to the step shown in FIG. 12A. Using a first photoresist mask, the second polysilicon layer is patterned to form at least a plurality of drain offset regions 119. Preferably, the second polysilicon layer is patterned to also form a plurality of source offset regions 118, such that a plurality of drain offset regions 119 are located over the drain regions 115 and a plurality of source offset regions 118 are located over the source regions 115, as shown in FIGS. 8 and 9.

Using the same first photoresist mask, the first polysilicon layer is patterned to form a first plurality of rails 102, 104 comprising a plurality of source regions 114, under the source offset regions 118, and to form a second plurality of rails 106, 108 comprising a plurality of drain regions 115 under the drain offset regions 119, as shown in FIG. 8. The insulating fill layer 121 is formed between the rails and planarized by chemical mechanical polishing.

Subsequently, a third polysilicon layer of a first conductivity type is formed over the plurality of the drain offset region. A first insulating layer is formed over the third polysilicon layer. A conductive film is formed over the first insulating layer. The third polysilicon layer, the first insulating layer and the conductive film are then patterned using a second mask to form a plurality of spaced-apart rail stacks 110 each comprising the channel region 113, the gate insulating layer 116 and the gate electrode 117, as shown in FIG. 8. The plurality of channel regions 113 are in contact with the plurality of drain offset regions 119 and the plurality of the source offset regions 118.

The memory array structure of FIG. 8 can be easily extrapolated to three dimensions, as shown in FIG. 9. To do this, an interlayer insulating layer 120 is deposited over and between the third rail-stacks 110. This layer 120 prevents shorting one set of gate lines or word lines with the next set of bit lines (i.e., source or drain lines). Then another layer of first and second rails is constructed over the interlayer insulating layer followed by forming a filler insulating layer followed by a deposition of another set of third rail-stacks. This process can be repeated a number of times, as desired, to form two or more device levels (such as eight levels, for example). If desired, an additional insulating layer may be formed between the rail stacks and planarized by chemical mechanical polishing prior to forming layer 120.

To form the FN tunneling TFT EEPROM array 200 of FIG. 11, an additional masking and etching step is added to the above method. A third mask is formed over the third polysilicon layer and the third polysilicon layer is patterned to form a plurality of strips (which extend in and out of the page in FIG. 11). Then the strips of the third polysilicon layer, the first insulating layer and the conductive film are patterned using the second mask to form a plurality of spaced-apart rail stacks 110, such that the channel regions 213 comprise polysilicon islands, as shown in FIG. 11. The array 200 is then completed in the same manner as array 100.

By reversing the order of deposition steps, the gate 117 is formed below the channel 113, while the source 114 and drain 115 regions are formed above the channel, to form an array of bottom gate staggered TFTs according to the eighth preferred embodiment. A conductive film is formed over the substrate, a first insulating layer is formed over the conductive film and a third polysilicon layer of a first conductivity type is formed over the first insulating layer. The third polysilicon layer, the first insulating layer and the conductive film are patterned to form a plurality of spaced-apart rail stacks 110 each comprising the channel region, the gate insulating layer and the gate electrode. If desired, a planarized insulating fill layer may be formed between the rail stacks.

An intrinsic or lightly doped second polysilicon layer of the second conductivity type is formed over the spaced-apart rail stacks. A heavily doped first polysilicon layer of the second conductivity type is formed over the first polysilicon layer. The second polysilicon layer is patterned to form a plurality of drain offset regions 119. Preferably, the source offset regions 118 are also formed during this patterning step. The first polysilicon layer is patterned to form a first plurality of rails 102, 104 comprising a plurality of source regions 114 and to form a second plurality of rails 106, 108 comprising a plurality of drain regions 115 over the drain offset regions 119. Thus, the array of the eighth preferred embodiment is formed.

It should be noted that any of the methods of forming TFTs illustrated in FIGS. 12–17 may be extrapolated for forming arrays of TFTs. Thus, for example, the method of making the bottom gate staggered TFT 60 of the fifth preferred embodiment may be used to form the array 160 of the ninth preferred embodiment, as illustrated in FIG. 10.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. The drawings are not necessarily to scale and illustrate the device in schematic block format. It is intended that the scope of the invention be defined by the claims appended hereto, and their equivalents.

What is claimed is:

1. A completed semiconductor device, comprising:
   a substrate having an upper first surface;
   a semiconductor channel region of a first conductivity type over the first surface;
   a gate electrode;
   a gate insulating layer between the gate electrode and the channel region;
   a heavily doped semiconductor source region of a second conductivity type;
   a heavily doped semiconductor drain region of a second conductivity type; and
   an intrinsic or lightly doped semiconductor drain offset region located between the drain region and the channel region, such that the drain region is offset from the channel region at least partially in a direction perpendicular to the first surface.

2. The device of claim 1, wherein the gate electrode is offset from the drain region at least partially in a direction perpendicular to the first surface.

3. The device of claim 2, wherein the drain region is offset from the channel region in a direction perpendicular to the first surface.

4. The device of claim 2, wherein the drain region is offset from the channel region in both parallel and perpendicular directions to the first surface.

5. The device of claim 1, wherein the offset region comprises an intrinsic semiconductor region.

6. The device of claim 1, where the offset region comprises a lightly doped semiconductor region of the second conductivity type.

7. The device of claim 1, further comprising an intrinsic or lightly doped semiconductor source offset region of the second conductivity type located between the source region and the channel region, such that the source region is offset from the channel region at least partially in a direction perpendicular to the first surface.

8. The device of claim 1, wherein:
   the first surface comprises an insulating surface;
   the channel region comprises a polysilicon or an amorphous silicon layer;
   the source region comprises a polysilicon layer located above or below a first portion of the channel region;
   the drain region comprises a polysilicon layer located above or below a second portion of the channel region; and
   the drain offset region comprises a polysilicon layer located between the channel region and the drain region.

9. The device of claim 8, further comprising a planarized insulating fill layer located between the source region and the drain region.

10. The device of claim 9, wherein:
    the gate electrode and the gate insulating layer are located above the channel region; and
    the source region, the drain region and the drain offset region are located below the channel region.

11. The device of claim 9, wherein:
    the gate electrode and the gate insulating layer are located below the channel region; and the source region, the drain region and the drain offset region are located above the channel region.

12. The device of claim 1, wherein:

the first surface comprises an insulating surface;

the channel region comprises a polysilicon or an amorphous silicon layer;

the source region comprises a polysilicon layer located above or below and laterally spaced from a first portion of the channel region;

the drain region comprises a polysilicon layer located above or below and laterally spaced from a second portion of the channel region; and the drain offset region comprises a polysilicon layer located between the channel region and the drain region, and contacting a lateral edge of the channel region.

13. The device of claim 12, further comprising a planarized insulating fill layer located between the source region and the drain region.

14. The device of claim 1, further comprising:

a first metal or a metal silicide layer in contact with the source region; and a second metal or a metal silicide layer in contact with the drain region.

15. The device of claim 1, wherein the gate insulating layer comprises a portion of a charge storage region.

16. The device of claim 15, wherein the charge storage region comprises a dielectric isolated floating gate, an ONO dielectric film or an insulating layer containing conductive nanocrystals.

17. The device of claim 1, wherein the gate electrode and the gate insulating layer extend above or below an entire length of the channel region.

18. An array of semiconductor devices comprising a plurality of semiconductor devices of claim 1.

19. The array of claim 18, wherein the array comprises:

(a) a first plurality rails disposed at a first height above the substrate in a first direction;
    wherein each of the first plurality of rails comprises a heavily doped semiconductor source line of a second conductivity type;

(b) a second plurality rails disposed at the first height above the substrate in the first direction;
    wherein said second plurality of rails are interspersed with and spaced apart from the first plurality of rails; and
    wherein each of the second plurality of rails comprises a heavily doped semiconductor drain line of the second conductivity type and an intrinsic or a lightly doped semiconductor drain offset of the second conductivity type; and (c) a third plurality of spaced-apart rail-stacks disposed at a second height different from the first height in a second direction different from the first direction, each rail-stack comprising:
    a semiconductor layer of the first conductivity type whose first surface is in contact with the first and the second plurality of rails;
    a conductive film; and
    a charge storage film disposed between a second surface of the semiconductor layer and the conductive film.

20. The array of 19, wherein each semiconductor device of the array comprises:

a portion of the source line as a source region;

a portion of the drain line as a drain region;

a portion of the drain offset as a drain offset region;

a portion of the semiconductor layer between a first rail and an adjacent second rail as a channel region;

a portion of the conductive film above the channel region as the gate electrode.

21. The array of claim 20, wherein:

said semiconductor layer comprises polysilicon; and said charge storage film is selected from a group consisting of a dielectric isolated floating gate, an ONO dielectric film, and an insulating layer containing conductive nanocrystals.

22. The array of claim 21, further comprising:

a planarized first insulating material located in a space between adjacent first and second rails; and a planarized second insulating material located in a space between adjacent spaced-apart rail-stacks.

23. The array of claim 20, wherein the array comprises a monolithic three dimensional array of memory devices.

24. A completed array of thin film transistors, comprising:

(a) a substrate;

(b) a first plurality rails disposed at a first height above the substrate in a first direction;
    wherein each of the first plurality of rails comprises a heavily doped semiconductor source line of a first conductivity type;

(c) a second plurality rails disposed at the first height above the substrate in the first direction;
    wherein said second plurality of rails are interspersed with and spaced apart from the first plurality of rails; and
    wherein each of the second plurality of rails comprises a heavily doped semiconductor drain line of the first conductivity type and an intrinsic or a lightly doped semiconductor drain offset of the first conductivity type; and (d) a third plurality of spaced-apart rail-stacks disposed at a second height different from the first height in a second direction different from the first direction, each rail-stack comprising:
    a semiconductor layer of a second conductivity type whose first surface is in contact with the first and the second plurality of rails;
    a conductive film; and
    a charge storage film disposed between a second surface of the semiconductor layer and the conductive film.

25. The array of claim 24, wherein the third plurality of spaced-apart rail-stacks are located above the first and the second plurality of rails.

26. The array of claim 24, wherein the third plurality of spaced-apart rail-stacks are located below the first and the second plurality of rails.

27. The array of claim 24 wherein a space between the first and the second rails contains a planarized deposited insulating material.

28. The array of claim 27 wherein said semiconductor in the first rails, the second rails and the third rail stacks comprises polysilicon.

29. The device of claim 24, wherein the charge storage film comprises a dielectric isolated floating gate, an ONO dielectric film or an insulating layer containing conductive nanocrystals.

30. The device of claim 24, wherein the conductive film comprises a polysilicon layer and an overlying metal silicide layer.

31. The array of 24, wherein each thin film transistor of the array comprises:
a portion of the source line as a source region;
a portion of the drain line as a drain region;
a portion of the drain offset as a drain offset region;
a portion of the semiconductor layer between a first rail and an adjacent second rail as a channel region;
a portion of the conductive film above the channel region as the gate electrode.

32. The device of claim 31, wherein the drain region is offset from the channel region in a direction perpendicular to the substrate.

33. The device of claim 31, wherein the drain region is offset from the channel region in both parallel and perpendicular directions to the substrate.

34. The device of claim 31, wherein the drain offset region comprises an intrinsic semiconductor region.

35. The device of claim 31, where the drain offset region comprises a lightly doped semiconductor region of the first conductivity type.

36. The device of claim 31, further comprising an intrinsic or lightly doped semiconductor source offset region of the first conductivity type located between the source region and the channel region, such that the source region is offset from the channel region at least partially in a direction perpendicular to the substrate.

37. The device of claim 31, wherein:
the source region is located above or below and laterally spaced from a first portion of the channel region;
the drain region is located above or below and laterally spaced from a second portion of the channel region; and
the drain offset region is located between the channel region and the drain region, and contacts a lateral edge of the channel region.

38. The device of claim 31, further comprising:
a first metal or a metal silicide layer in contact with the source region; and
a second metal or a metal silicide layer in contact with the drain region.

39. The array of claim 24, wherein the array comprises a memory array of EEPROM thin film transistors.

40. The array of claim 39, wherein:
the semiconductor layer comprises a plurality of discrete islands in the third plurality of rail stacks; and
the array comprises an array of EEPROM thin film transistors that are programmable by Fowler-Nordheim tunneling.

41. A monolithic three dimensional array of thin film transistors comprising a plurality of arrays of claim 24 separated by at least one interlayer insulating layer.

42. A method of making a semiconductor device, comprising:
providing a substrate having an insulating upper first surface;
forming a semiconductor channel region of a first conductivity type over the first surface;
forming a gate insulating layer;
forming a gate electrode such that the gate insulating layer is located between the gate electrode and the channel region;
forming a heavily doped semiconductor source region of a second conductivity type;
forming a heavily doped semiconductor drain region of the second conductivity type; and
forming an intrinsic or lightly doped semiconductor drain offset region of the second conductivity type located between the drain region and the channel region, such that the drain region is offset from the channel region at least partially in a direction perpendicular to the first surface.

43. The method of claim 42, wherein the gate electrode is offset from the channel region at least partially in a direction perpendicular to the first surface.

44. The method of claim 43, wherein the drain region is offset from the channel region in a direction perpendicular to the first surface.

45. The method of claim 43, wherein the drain region is offset from the channel region in both parallel and perpendicular directions to the first surface.

46. The method of claim 42, wherein the offset region comprises an intrinsic semiconductor region.

47. The method of claim 42, where the offset region comprises a lightly doped semiconductor region of the second conductivity type.

48. The method of claim 42, further comprising forming an intrinsic or lightly doped semiconductor source offset region of the second conductivity type, such that the source offset region is located between the source region and the channel region, such that the source region is offset from the channel region at least partially in a direction perpendicular to the first surface.

49. The method of claim 42, further comprising:
forming a heavily doped first polysilicon layer of the second conductivity type over the substrate;
forming an intrinsic or a lightly doped second polysilicon layer of the second conductivity type over the first polysilicon layer;
patterning the second polysilicon layer to form at least a drain offset region;
patterning the first polysilicon layer to form the source region and the drain region under the drain offset region;
forming a third polysilicon layer of a first conductivity type over the drain offset region;
patterning the third polysilicon layer to form a channel region in contact with the drain offset region;
forming a first insulating layer over the third polysilicon layer;
forming a conductive film over the first insulating layer; and
patterning the first insulating layer and the conductive film to form a gate insulating layer and a gate electrode.

50. The method of claim 49, wherein:
the step of patterning the second polysilicon layer comprises forming a drain offset region located over the drain region and forming a source offset region located over the source region;
the step of patterning the third polysilicon layer comprises forming a channel region in contact with the drain offset region and the source offset region; and
the step of forming the first insulating layer comprises forming the first insulating layer over the third polysilicon layer either before or after the step of patterning the third polysilicon layer.

51. The method of claim 49, further comprising:
patterning the second polysilicon layer to form a source offset region; and
selectively implanting ions of a second conductivity type into the source offset region to convert the source offset region into a heavily doped an upper portion of the source region of the second conductivity type.

52. The method of claim 49, wherein:

the step of forming the second polysilicon layer precedes the step of patterning the first polysilicon layer; and the steps of patterning the first polysilicon layer and patterning the second polysilicon layer comprise etching the first and the second polysilicon layers using a same photoresist mask.

53. The method of claim 49, further comprising:

forming a second insulating layer after the step of patterning the second polysilicon layer and before the step of forming the third polysilicon layer; and planarizing the second insulating layer by chemical mechanical polishing using the drain offset region as a polish stop such that the second insulating layer is located between the source and the drain regions.

54. The method of claim 42, further comprising:

forming a conductive film over the substrate;

forming a first insulating layer over the conductive film;

patterning the first insulating layer and the conductive film to form a gate insulating layer and a gate electrode;

forming a third polysilicon layer of a first conductivity type over the gate insulating layer;

patterning the third polysilicon layer to form a channel region;

forming a lightly doped second polysilicon layer of the second conductivity type or an intrinsic second polysilicon layer over the channel region;

forming a heavily doped first polysilicon layer of the second conductivity type over the second polysilicon layer;

patterning the second polysilicon layer to form at least a drain offset region over the channel region; and patterning the first polysilicon layer to form the source region and to form the drain region over the drain offset region.

55. The method of claim 54, wherein:

the step of patterning the second polysilicon layer comprises forming a drain offset region over the channel region; and the step of patterning the first polysilicon layer comprises forming the source region on the channel region and forming the drain region over the drain offset region.

56. The method of claim 54, wherein:

the step of patterning the second polysilicon layer comprises forming the drain offset region and a source offset region located over the channel region; and the step of patterning the first polysilicon layer comprises forming the source region over the source offset region and forming the drain region over the drain offset region.

57. The method of claim 56, wherein:

the step of forming the first polysilicon layer precedes the step of patterning the second polysilicon layer; and the steps of patterning the first polysilicon layer and patterning the second polysilicon layer comprise etching the first and the second polysilicon layers using the same photoresist mask.

58. The method of claim 54, further comprising:

forming a second insulating layer after the step of patterning the first polysilicon layer; and planarizing the second insulating layer by chemical mechanical polishing using the source and drain regions as a polish stop such that the second insulating layer is located between the source and the drain regions.

59. The method of claim 42, further comprising:

forming a conductive film over the substrate;

forming a first insulating layer over the conductive film;

patterning the first insulating layer and the conductive film to form a gate insulating layer and a gate electrode;

forming a lightly doped second polysilicon layer of the second conductivity type or an intrinsic second polysilicon layer over the gate insulating layer;

forming a heavily doped first polysilicon layer of the second conductivity type over the second polysilicon layer;

patterning the second polysilicon layer to form at least a drain offset region over the gate insulating layer;

patterning the first polysilicon layer to form the source region and to form the drain region over the drain offset region;

forming a third polysilicon layer of a first conductivity type over the source and the drain regions and over an exposed portion of the gate insulating layer between the source and the drain regions; and patterning the third polysilicon layer to form a channel region over the gate insulating layer and between the source and the drain regions.

60. The method of claim 59, wherein:

the step of patterning the second polysilicon layer comprises forming a drain offset region over the channel region; and the step of patterning the first polysilicon layer comprises forming the source region on the gate insulating layer and forming the drain region over the drain offset region.

61. The method of claim 59, wherein:

the step of patterning the second polysilicon layer comprises forming the drain offset region and a source offset region over the gate insulating layer; and the step of patterning the first polysilicon layer comprises forming the source region over the source offset region and forming the drain region over the drain offset region.

62. The method of claim 61, wherein:

the step of forming the first polysilicon layer precedes the step of patterning the second polysilicon layer; and the steps of patterning the first polysilicon layer and patterning the second polysilicon layer comprise etching the first and the second polysilicon layers using the same photoresist mask.

63. The method of claim 59, further comprising:

forming a second insulating layer after the step of patterning the third polysilicon layer; and planarizing the second insulating layer by chemical mechanical polishing using the source and drain regions as a polish stop such that the second insulating layer is located between the source and the drain regions.

64. The method of claim 42, wherein the steps of forming the source region, the drain region and the drain offset region comprise:

forming a second insulating layer;

forming openings in the second insulating layer;

forming a heavily doped first polysilicon layer of a second conductivity type and an intrinsic or lightly doped polysilicon layer of a second conductivity type in the openings; and chemically-mechanically planarizing the first and the second polysilicon layers such that the source region is formed in a first opening and the drain region and the drain offset region are formed in a second opening.

65. The method of claim 42, wherein the steps of forming the source region, the drain region and the drain offset region comprise:

forming a patterned intrinsic or lightly doped polysilicon layer of the second conductivity type;

forming an insulating layer between patterned portions of the polysilicon layer;

implanting ions of the second conductivity type at least into upper portions of the polysilicon layer; and performing an activation anneal to form the source and drain regions in the upper portions of the polysilicon layer and at least a drain offset region in a lower portion of the polysilicon layer.

66. The method of claim 42, wherein the gate insulating layer comprises a portion of a charge storage region.

67. The method of claim 42, further comprising:

forming a heavily doped first polysilicon layer of the second conductivity type over the substrate;

forming a lightly doped second polysilicon layer of the second conductivity type or an intrinsic second polysilicon layer over the first polysilicon layer;

patterning the second polysilicon layer to form at least a plurality of drain offset regions;

patterning the first polysilicon layer to form a first plurality of rails comprising a plurality of source regions and to form a second plurality of rails comprising a plurality of drain regions under the drain offset regions;

forming a third polysilicon layer of a first conductivity type over the plurality of the drain offset regions;

forming a first insulating layer over the third polysilicon layer;

forming a conductive film over the first insulating layer; and patterning the third polysilicon layer, the first insulating layer and the conductive film to form a plurality of spaced-apart rail stacks each comprising the channel region, the gate insulating layer and the gate electrode.

68. The method of claim 67, further comprising patterning the third polysilicon layer to form a plurality of strips prior to patterning the third polysilicon layer to form a plurality of spaced-apart rail stacks, such that the channel regions in the rail stacks comprise polysilicon islands.

69. The method of claim 67, wherein:

the step of patterning the second polysilicon layer comprises forming the plurality of drain offset regions over the drain regions and forming a plurality of source offset regions over the source regions; and the step of patterning the third polysilicon layer comprises forming a plurality of channel regions in contact with the plurality of the drain offset regions and the plurality of the source offset regions.

70. The method of claim 42, further comprising:

forming a conductive film over the substrate;

forming a first insulating layer over the conductive film;

forming a third polysilicon layer of a first conductivity type over the first insulating layer;

patterning the third polysilicon layer, the first insulating layer and the conductive film to form a plurality of spaced-apart rail stacks each comprising the channel region, the gate insulating layer and the gate electrode;

forming a lightly doped second polysilicon layer of the second conductivity type or an intrinsic second polysilicon layer over the spaced-apart rail stacks;

forming a heavily doped first polysilicon layer of the second conductivity type over the second polysilicon layer;

patterning the second polysilicon layer to form a plurality of drain offset regions; and patterning the first polysilicon layer to form a first plurality of rails comprising a plurality of source regions and to form a second plurality of rails comprising a plurality of drain regions over the drain offset regions.

71. The method of claim 70, wherein:

the step of patterning the second polysilicon layer comprises forming a plurality of the drain offset regions and a plurality of source offset regions over the rail stacks; and the step of patterning the first polysilicon layer comprises forming a plurality of the source regions over the source offset regions and forming a plurality of the drain regions over the drain offset regions.

* * * * *